US012236912B2

(12) United States Patent
Liao et al.

(10) Patent No.: US 12,236,912 B2
(45) Date of Patent: Feb. 25, 2025

(54) DISPLAY PANEL, DRIVING METHOD FOR THE DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yanping Liao, Beijing (CN); Yingmeng Miao, Beijing (CN); Seungmin Lee, Beijing (CN); Xibin Shao, Beijing (CN); Shulin Yao, Beijing (CN); Yinlong Zhang, Beijing (CN); Qiujie Su, Beijing (CN); Cong Wang, Beijing (CN); Dongchuan Chen, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/915,712

(22) PCT Filed: Oct. 28, 2021

(86) PCT No.: PCT/CN2021/126857
§ 371 (c)(1),
(2) Date: Sep. 29, 2022

(87) PCT Pub. No.: WO2022/213583
PCT Pub. Date: Oct. 13, 2022

(65) Prior Publication Data
US 2024/0212643 A1    Jun. 27, 2024

(30) Foreign Application Priority Data
Apr. 9, 2021 (CN) .......................... 202110381834.1

(51) Int. Cl.
*G09G 3/36* (2006.01)
*G09G 3/3266* (2016.01)
*G11C 19/28* (2006.01)

(52) U.S. Cl.
CPC ......... *G09G 3/3677* (2013.01); *G09G 3/3266* (2013.01); *G09G 2310/0213* (2013.01);
(Continued)

(58) Field of Classification Search
CPC .................................................. G09G 3/3677
(Continued)

(56) References Cited

U.S. PATENT DOCUMENTS 10,048,559 B2    8/2018    Zhou
2002/0149318 A1    10/2002    Jeon et al.
(Continued)

FOREIGN PATENT DOCUMENTS

CN    103050077 A    4/2013
CN    103077689 A    5/2013
(Continued)

OTHER PUBLICATIONS

First Office Action dated May 11, 2023 received in Chinese Patent Application No. CN 202110381834.1.

*Primary Examiner* — Long D Pham
(74) *Attorney, Agent, or Firm* — Scully, Scott, Murphy & Presser, P.C.

(57) ABSTRACT

A display panel, a driving method for the display panel and a display device. The display panel includes a gate driving circuit, the gate driving circuit includes shift registers of a plurality of stages arranged in sequence, the shift registers of the plurality of stages arranged in sequence are combined into N groups of gate driving sub-circuits, and shift registers in the N groups of gate driving sub-circuits are cascaded, respectively; an m-th group of gate driving sub-circuits in
(Continued)

the N groups of gate driving sub-circuits comprises a shift register of an m-th stage and a shift register of an (m+L*N)th stage that are cascaded, where m is an integer that is greater than or equal to 1 and less than or equal to N, L is an integer that is greater than or equal to 1, N is an even number that is greater than or equal to 2.

18 Claims, 13 Drawing Sheets

(52) U.S. Cl.
CPC ............... *G09G 2310/0227* (2013.01); *G09G 2310/0267* (2013.01); *G09G 2310/0286* (2013.01); *G09G 2310/08* (2013.01); *G11C 19/28* (2013.01)

(58) Field of Classification Search
USPC ........................................................ 345/204
See application file for complete search history.

(56) References Cited

U.S. PATENT DOCUMENTS

| | | | |
|---|---|---|---|
| 2006/0145998 A1* | 7/2006 | Cho | G09G 3/3677 345/100 |
| 2008/0180588 A1 | 7/2008 | Ando | |
| 2012/0307172 A1 | 12/2012 | Yoshida | |
| 2015/0187320 A1 | 7/2015 | Ren | |
| 2016/0033830 A1 | 2/2016 | Park et al. | |
| 2016/0035299 A1 | 2/2016 | He | |
| 2016/0125954 A1 | 5/2016 | Gu | |
| 2017/0372664 A1 | 12/2017 | He et al. | |
| 2018/0157135 A1 | 6/2018 | Wang et al. | |
| 2019/0073987 A1 | 3/2019 | Lin et al. | |
| 2019/0155433 A1* | 5/2019 | Park | G06F 3/04184 |
| 2019/0206293 A1 | 7/2019 | Tian et al. | |
| 2020/0271987 A1 | 8/2020 | Park et al. | |
| 2021/0027707 A1 | 1/2021 | Park et al. | |
| 2021/0066439 A1* | 3/2021 | Kim | H10K 59/38 |
| 2021/0327388 A1* | 10/2021 | Iwase | G09G 3/3674 |
| 2022/0383787 A1* | 12/2022 | Meng | G09G 3/20 |

FOREIGN PATENT DOCUMENTS

| | | |
|---|---|---|
| CN | 103700358 A | 4/2014 |
| CN | 103928001 A | 7/2014 |
| CN | 104332181 A | 2/2015 |
| CN | 105045012 A | 11/2015 |
| CN | 105223749 A | 1/2016 |
| CN | 105405385 A | 3/2016 |
| CN | 105489178 A | 4/2016 |
| CN | 107068032 A | 8/2017 |
| CN | 107967888 A | 4/2018 |
| CN | 109388264 A | 2/2019 |
| CN | 109461411 A | 3/2019 |
| CN | 111610675 A | 9/2020 |
| CN | 112309324 A | 2/2021 |
| CN | 112951140 A | 6/2021 |
| CN | 215220225 U | 12/2021 |

* cited by examiner

DISPLAY PANEL, DRIVING METHOD FOR THE DISPLAY PANEL AND DISPLAY DEVICE

CROSS-REFERENCE TO RELATED APPLICATIONS

This application is a U.S. national phase entry of PCT International Application No. PCT/CN2021/126857, filed on Oct. 28, 2021, which claims priority to Chinese Patent Application No. 202110381834.1, filed on Apr. 9, 2021. The entire disclosure of PCT International Application No. PCT/CN2021/126857 and the entire disclosure of Chinese Patent Application No. 202110381834.1 are incorporated herein by reference as part of the subject disclosure.

TECHNICAL FIELD

Embodiments of the present disclosure relate to a display panel, a driving method for the display panel and a display device.

BACKGROUND

In the field of display technology, for example, a pixel array of a liquid crystal display panel or an organic light-emitting diode (OLED) display panel generally includes a plurality of rows of gate scanning signal lines and a plurality of columns of data lines interlaced with the gate scanning signal lines. The driving of the gate scanning signal lines can be realized by a bonded integrated driving circuit. In recent years, with the continuous improvement of the manufacturing process of amorphous silicon thin film transistors or oxide thin film transistors, driving circuit of the gate scanning signal lines can also be directly integrated on the thin film transistor array substrate to form GOA (Gate driver On Array) to drive the gate scanning signal lines. For example, a GOA including a plurality of shift register units that are cascaded may be used to provide switching state voltage signals (scanning signals) for the plurality of rows of gate scanning signal lines of the pixel array, so as to, for example, control the plurality of rows of gate scanning signal lines to be sequentially turned on, and at the same time, the data lines provide data signals to pixel units of the corresponding row in the pixel array, so as to form grayscale voltages required for each grayscale of the display image in each pixel unit, and then display one frame of image.

SUMMARY

At least one embodiment of the present disclosure provides a display panel, comprising a gate driving circuit, the gate driving circuit comprises shift registers of a plurality of stages arranged in sequence, the shift registers of the plurality of stages arranged in sequence are combined into N groups of gate driving sub-circuits, and shift registers in the N groups of gate driving sub-circuits are cascaded, respectively; an m-th group of gate driving sub-circuits in the N groups of gate driving sub-circuits comprises a shift register of an m-th stage and a shift register of an (m+L*N)-th stage that are cascaded; m is an integer that is greater than or equal to 1 and less than or equal to N, L is an integer that is greater than or equal to 1, and N is an even number that is greater than or equal to 2.

For example, the display panel provided by at least one embodiment of the present disclosure further comprises N trigger signal lines, which are connected to the N groups of gate driving sub-circuits, respectively; an m-th trigger signal line in the N trigger signal lines is connected to an input terminal of the shift register of the m-th stage.

For example, the display panel provided by at least one embodiment of the present disclosure further comprises 4K clock signal lines; the 4K clock signal lines comprise a first clock signal line to a (4K)-th clock signal line, which are connected to clock signal terminals of the shift registers of the plurality of stages, respectively, to provide clock signals, wherein K is an integer that is greater than or equal to 1.

For example, in the display panel provided by at least one embodiment of the present disclosure, in a case where K=1, the 4K clock signal lines comprise a first clock signal line, a second clock signal line, a third clock signal line and a fourth clock signal line, the first clock signal line is connected to a clock signal terminal of a shift register of a (4n−3)-th stage; the second clock signal line is connected to a clock signal terminal of a shift register of a (4n−2)-th stage; the third clock signal line is connected to a clock signal terminal of a shift register of a (4n−1)-th stage; and the fourth clock signal line is connected to a clock signal terminal of a shift register of a (4n)-th stage, wherein n is an integer that is greater than or equal to 1.

For example, in the display panel provided by at least one embodiment of the present disclosure, in a case where K=3, the 4K clock signal lines comprise a first clock signal line, a second clock signal line, a third clock signal line, a fourth clock signal line, a fifth clock signal line, a sixth clock signal line, a seventh clock signal line, an eighth clock signal line, a ninth clock signal line, a tenth clock signal line, an eleventh clock signal line, and a twelfth clock signal line, the first clock signal line is connected to a clock signal terminal of a shift register of a (12n−11)-th stage; the second clock signal line is connected to a clock signal terminal of a shift register of a (12n−10)-th stage; the third clock signal line is connected to a clock signal terminal of a shift register of a (12n−9)-th stage; the fourth clock signal line is connected to a clock signal terminal of a shift register of a (12n−8)-th stage; the fifth clock signal line is connected to a clock signal terminal of a shift register of a (12n−7)-th stage; the sixth clock signal line is connected to a clock signal terminal of a shift register of a (12n−6)-th stage; the seventh clock signal line is connected to a clock signal terminal of a shift register of a (12n−5)-th stage; the eighth clock signal line is connected to a clock signal terminal of a shift register of a (12n−4)-th stage; the ninth clock signal line is connected to a clock signal terminal of a shift register of a (12n−3)-th stage; the tenth clock signal line is connected to a clock signal terminal of a shift register of a (12n−2)-th stage; the eleventh clock signal line is connected to a clock signal terminal of a shift register of a (12n−1)-th stage; and the twelfth clock signal line is connected to a clock signal terminal of a shift register of a (12n)-th stage, wherein n is an integer greater that is than or equal to 1.

For example, in the display panel provided by at least one embodiment of the present disclosure, in a case where N=2, the N trigger signal lines comprise a first trigger signal line and a second trigger signal line, the first trigger signal line is connected to input terminals of shift registers of first K odd-numbered stages to provide a first trigger signal, and input terminals of shift registers of remaining odd-numbered stages are respectively connected to output terminals of shift registers of preceding stages that are respectively separated by K−1 odd-numbered stages; the second trigger signal line is connected to input terminals of shift registers of first K even-numbered stages to provide a second trigger signal, and input terminals of shift registers of remaining even-numbered stages are respectively connected to output terminals of shift registers of preceding stages that are respectively separated by K−1 even-numbered stages.

For example, the display panel provided by at least one embodiment of the present disclosure further comprises a clock controller, which is connected to the 4K clock signal lines and is configured to: upon providing clock signals to clock signal lines connected to odd-numbered groups of gate driving sub-circuits in the N groups of gate driving sub-circuits, not provide the clock signals to clock signal lines connected to even-numbered groups of gate driving sub-circuits in the N groups of gate driving sub-circuits or provide invalid clock signals to the clock signal lines connected to the even-numbered groups of gate driving sub-circuits; and upon providing the clock signals to the clock signal lines connected to the even-numbered groups of gate driving sub-circuits, not provide the clock signals to the clock signal lines connected to the odd-numbered groups of gate driving sub-circuits or provide the invalid clock signals to the clock signal lines connected to the odd-numbered groups of gate driving sub-circuits.

For example, in the display panel provided by at least one embodiment of the present disclosure, a time difference between clock signals received by two adjacent clock signal lines connected to the odd-numbered groups of gate driving sub-circuits is 2 T, and a time difference between clock signals received by two adjacent clock signal lines connected to the even-numbered groups of gate driving sub-circuits is 2 T, wherein T is a charging duration of one row of sub-pixels.

For example, in the display panel provided by at least one embodiment of the present disclosure, the clock controller is further connected to the N trigger signal lines, and is further configured to: upon providing valid trigger signals to trigger signal lines connected to the odd-numbered groups of gate driving sub-circuits, provide invalid trigger signals or not provide the valid trigger signals to trigger signal lines connected to the even-numbered groups of gate driving sub-circuits; and upon providing the valid trigger signals to the trigger signal lines connected to the even-numbered groups of gate driving sub-circuits, provide the invalid trigger signals or not provide the valid trigger signals to the trigger signal lines connected to the odd-numbered groups of gate driving sub-circuits.

For example, the display panel provided by at least one embodiment of the present disclosure further comprises a pixel array which is connected to the gate driving circuit; the pixel array comprises a plurality of rows of sub-pixels and a plurality of columns of sub-pixels; the odd-numbered groups of gate driving sub-circuits in the N groups of gate driving sub-circuits are connected to odd-numbered rows of sub-pixels, respectively, the even-numbered groups of gate driving sub-circuits in the N groups of gate driving sub-circuits are connected to even-numbered rows of sub-pixels, respectively.

For example, the display panel provided by at least one embodiment of the present disclosure further comprises a data driving circuit and a plurality of data lines; the plurality of data lines are electrically connected to the plurality of columns of sub-pixels, and are configured to transmit data signals provided by the data driving circuit to the plurality of columns of sub-pixels; and the data driving circuit is configured to: upon the pixel array being driven to display an x-th frame of pattern, provide a data signal with a first level to the plurality of data lines, and upon the pixel array being driven to display an (x+1)-th frame of pattern, provide a data signal with a second level to the plurality of data rows, wherein x is an integer greater than or equal to 1.

For example, in the display panel provided by at least one embodiment of the present disclosure, the gate driving circuit is on one side of the pixel array.

For example, in the display panel provided by at least one embodiment of the present disclosure, the gate driving circuits are on two sides of the pixel array, and shift registers in a same stage of the gate driving circuits located on the two sides are used to drive a same row of sub-pixels.

For example, in the display panel provided by at least one embodiment of the present disclosure, the shift registers of the plurality of stages arranged in sequence comprise a plurality of dummy shift registers, and input terminals of dummy shift registers of N stages in the plurality of dummy shift registers are respectively connected to the N trigger signal lines to receive trigger signals.

At least one embodiment of the present disclosure further provides a display device, comprising the display panel according to any embodiment of the present disclosure.

At least one embodiment of the present disclosure further provides a driving method for a display panel, wherein the display panel comprises a pixel array and a plurality of gate scanning signal lines, the pixel array comprises a plurality of rows of sub-pixels and a plurality of columns of sub-pixels, and the plurality of gate scanning signal lines are connected to the plurality of rows of sub-pixels, respectively, the method comprises: upon the pixel array being driven to display an x-th frame of pattern, gate scanning signal lines of odd-numbered rows in the plurality of gate scanning signal lines outputting gate scanning signals, gate scanning signal lines of even-numbered rows in the plurality of gate scanning signal lines outputting invalid gate scanning signals or not outputting the gate scanning signal; and upon the pixel array being driven to display an (x+1)-th frame of pattern, the gate scanning signal lines of the even-numbered rows outputting the gate scanning signals, and the gate scanning signal lines of the odd-numbered rows outputting the invalid gate scanning signals or not outputting the gate scanning signals, wherein x is an odd number greater than or equal to 1.

For example, in the driving method provided by at least one embodiment of the present disclosure, the gate scanning signal lines of the odd-numbered rows are further connected to odd-numbered groups of gate driving sub-circuits, and the gate scanning signal lines of the even-numbered rows are further connected to even-numbered groups of gate driving sub-circuits, upon the pixel array being driven to display the x-th frame of pattern, clock signals are provided to clock signal lines connected to the odd-numbered groups of gate driving sub-circuits, the clock signals are not provided to or invalid clock signals are provided to clock signal lines connected to the even-numbered groups of gate driving sub-circuits; and upon the pixel array being driven to display the (x+1)-th frame of pattern, the clock signals are provided to the clock signal lines connected to the even-numbered groups of gate driving sub-circuits, the clock signals are not provided to or the invalid clock signals are provided to clock signal lines connected to the odd-numbered groups of gate driving sub-circuits.

For example, in the driving method provided by at least one embodiment of the present disclosure, upon the pixel array being driven to display the x-th frame of pattern, a time difference between clock signals provided by two adjacent clock signal lines connected to the odd-numbered groups of gate driving sub-circuits is 2 T, and upon the pixel array being driven to display the (x+1)-th frame of pattern, a time difference between clock signals provided by two adjacent clock signal lines connected to the even-numbered groups of gate driving sub-circuits is 2 T, wherein T is a charging duration of one row of sub-pixels.

For example, the driving method provided by at least one embodiment of the present disclosure further comprises upon the pixel array being driven to display the x-th frame of pattern, providing valid trigger signals to trigger signal lines connected to the odd-numbered groups of gate driving sub-circuits, providing invalid trigger signals or not providing the valid trigger signals to trigger signal lines connected to the even-numbered groups of gate driving sub-circuits; and upon the pixel array being driven to display the (x+1)-th frame of pattern, providing the valid trigger signals to the trigger signal lines connected to the even-numbered groups of gate driving sub-circuits, providing the invalid trigger signals or not providing the valid trigger signals to the trigger signal lines connected to the odd-numbered groups of gate driving sub-circuits.

For example, in the driving method provided by at least one embodiment of the present disclosure, the display panel further comprises a plurality of data lines that are electrically connected to the plurality of columns of sub-pixels, respectively, the method further comprises: upon the pixel array being driven to display the x-th frame of pattern, providing a first level to the plurality of data lines; and upon the pixel array being driven to display the (x+1)-th frame of pattern, providing a second level to the plurality of data lines.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
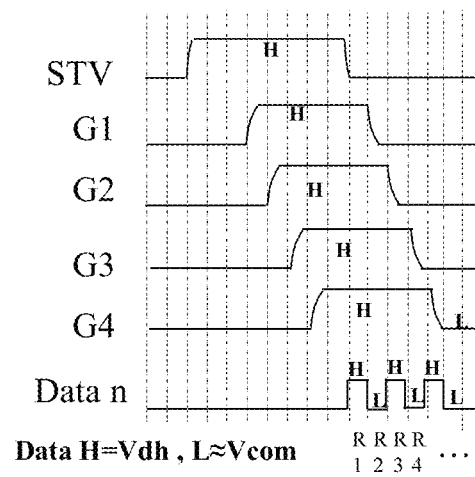
FIG. 1A is a schematic diagram of a timing sequence of a H-1 Line.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," "the," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "coupled", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. To keep the following description of the embodiments of the present disclosure clear and concise, detailed descriptions of well-known functions and well-known components may be omitted. When any component of an embodiment of the present disclosure appears in more than one drawing, the component is denoted by the same reference numeral in each drawing.

8K resolution+5G communication has become a hot topic in the current technological development. All TV manufacturers have products with 8K resolution (hereinafter referred to as "8K products") on the market, and each panel factory also quickly responds to market demand and quickly invests manpower in research and development. Products with 8K resolution, as high-end display products, require high refresh rates in addition to high pixels. Products with 8K resolution and a refresh rate of 120 hertz (Hz) (hereinafter referred to as "8K, 120 Hz products") have become standard for high-end display products. However, for 8K, 120 Hz products, a charging duration of 1 row of pixels is only 1/120 Hz/4500 rows=1.85 (microseconds); therefore, delay of a gate scanning signal and the delay of a data signal may greatly affect the charging duration of the pixel. And according to requirements of energy efficiency standards for household appliances, transmittance of 8K and 120 Hz products must be the same as that of products with a refresh rate of 60 Hz to meet the energy consumption requirements. Therefore, gate scanning signal lines and data lines of 8K, 120 Hz products cannot reduce load by increasing line width. Therefore, when a H-1 line pattern is displayed, the 8K, 120 Hz product has a large delay due to the gate scanning signal; and the data signal is flipped once per row, which lead to cross-row problems.

For cross-row problems, the industry has common test standards. For example, the test is performed through a CM (Contrast Modulation, abbreviated as luminance modulation ratio) value. The CM value refers to a luminance difference between black and white lines on the display pattern in H-1 Line and V-1 Line modes. For example, customers may judge the performance of a display product according to the CM value of H-1 Line or V-1 Line; for example, the higher the CM value, that is, the greater the luminance difference between the black and white lines (as shown in FIG. 1C), the better the performance of the display product. For example, ICDM (International Committee for Display Metrology) requires that the CM of 8K products is greater than 50%.

For example, the CM value may be represented by the following expression:

$$CM(H/V) = \frac{Lw - Lk}{Lw + Lk}, CM = \sqrt{(CMH^2 + CMV^2)/2},$$

Lw represents luminance of the white line; Lk represents luminance of the black line.

For example, for 8K products, there is no cross-row problem with V-1 Line. Due to the particularity of the pattern of H-1 Line, the data signal of H-1 Line has high and low jumps. When the delay of the gate scanning signal is large, the level of gate scanning signal is not converted in time, so that a data writing transistor in a pixel circuit not turned off in time, and the data signal has already flipped, resulting in cross-row of the H-1 Line.

Figure 1B:
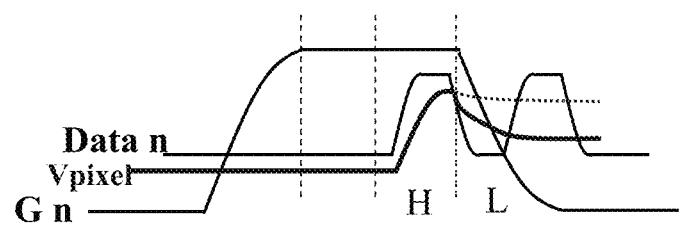
FIG. 1B is a schematic diagram of a cross-row timing sequence of a H-1 Line.
Figures 1C, 1D:
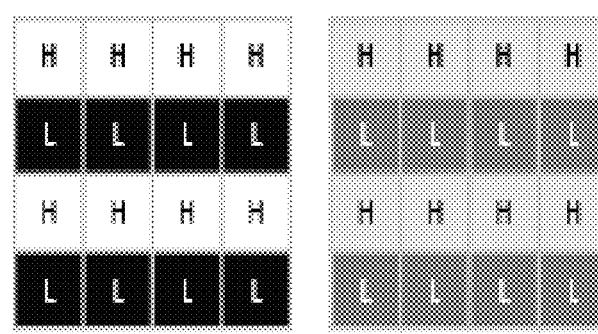
FIG. 1C is a schematic diagram of a display pattern of a H-1 Line in an ideal state.
FIG. 1D is a schematic diagram of a cross-row display pattern of a H-1 Line in an actual state.

FIG. 1A is a schematic diagram of a timing sequence of a H-1 Line; FIG. 1B is a schematic diagram of a cross-row timing sequence of a H-1 Line; FIG. 1C is a schematic diagram of a display pattern of a H-1 Line in an ideal state; FIG. 1D is a schematic diagram of a cross-row display pattern of a H-1 Line in an actual state.

For example, levels in FIG. 1A are set as shown in the table below:

| STV/Gn | H = Vgh | L = Vgl |
| Datan | H = Vdh | L = Vdl ≈ VCOM |

For example, as shown in FIG. 1A and FIG. 1B, the level of the data signal Datan is flipped (eg, flipped from a high level to a low level) every time one row of sub-pixels is charged. For example, when the data signal Datan corresponding to the sub-pixels in the current row (eg, the first row R1) is at a high level, the data signal Datan corresponding to the sub-pixels in the next row (eg, the second row R2) is at a low level. After the current row sub-pixel Vpixel is charged by the current row data signal Datan (for example, high level H), due to the large delay of the falling edge of the gate scanning signal Gn, the gate scanning signal is still at an active level, which enables the data writing transistor in the pixel circuit to be not turned off, and the data signal (for example, low level L) of the next row of sub-pixels is input to the current sub-pixel for charging, thereby causing the current row of sub-pixels Vpixel to be charged with the data signal (low level L) of the next row of data; therefore, the charging level of the current row of sub-pixels Vpixel changes from the ideal state to the actual state, for example, from the dashed line in FIG. 1B down to the solid line, resulting in cross-row; as a result, the pattern displayed by the display product is, such as shown in FIG. 1D, a pattern in which black lines are not black enough and white lines are not white enough, instead of the H-1 Line display pattern in the ideal state (For example, the black line as shown in FIG. 1C only shows black, and the white line shows only white pattern); therefore, the H-1 Line pattern produces cross-row. When the cross-row is serious, it can be seen that all the rows of the H-1 line pattern are all bright.

At least one embodiment of the present disclosure provides a display panel, which includes a gate driving circuit; the gate driving circuit includes shift registers of a plurality of stages arranged in sequence, the shift registers of the plurality of stages arranged in sequence are combined into N groups of gate driving sub-circuits, and shift registers in the N groups of gate driving sub-circuits are cascaded, respectively; an m-th group of gate driving sub-circuits in the N groups of gate driving sub-circuits comprises a shift register of an m-th stage and a shift register of an (m+L*N)-th stage that are cascaded, where m is an integer that is greater than or equal to 1 and less than or equal to N, L is an integer that is greater than or equal to 1, and N is an even number that is greater than or equal to 2.

The display panel of the embodiment of the present disclosure displays a H-1 Line pattern of the product by detecting, making odd-numbered frames display odd-numbered rows in conjunction with data signals, and making even-numbered frames display even-numbered rows in conjunction with data signals, thereby realizing a clear display of the H-1 Line pattern without cross-row problems, meeting industry test standards of CM value, and improving performance of display products.

The embodiments of the present disclosure and some examples thereof will be described in detail below with reference to the drawings.

Figure 2:
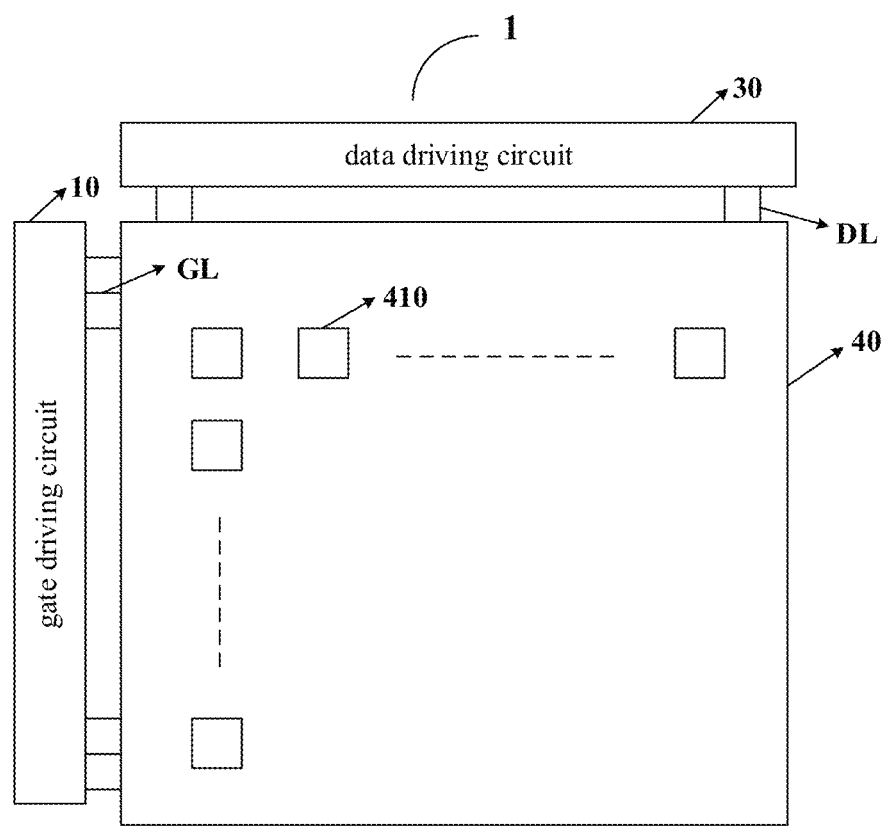
FIG. 2 is a schematic diagram of a display panel provided by at least one embodiment of the present disclosure.

FIG. 2 is a schematic diagram of a display panel provided by at least one embodiment of the present disclosure. For example, the display panel is a display panel with a resolution of 8K and a refresh rate of 120 Hz, or may be a display panel with other resolutions or refresh rates, which are not limited in the embodiments of the present disclosure. For example, as shown in FIG. 2, in some examples, the display panel 1 includes a gate driving circuit 10. For example, as shown in FIG. 2, in other examples, the display panel 1 further includes a display region 40, the display region 40 includes a pixel array connected to the gate driving circuit 10, and the pixel array includes a plurality of rows and a plurality of columns of sub-pixels 410. For example, in other examples, the display panel 1 further includes a data driving circuit 30 and a plurality of data lines DL. The plurality of data lines DL are electrically connected to the plurality of columns of sub-pixels 410 and configured to transmit data signals provided by the data driving circuit 30 to the plurality of columns of sub-pixels 410.

For example, the data driving circuit 30 is configured to provide data signals to the pixel array, and the gate driving circuit 10 is configured to provide gate scanning signals to the pixel array. The data driving circuit 30 is electrically connected to the sub-pixels 410 through a data line DL, and the gate driving circuit 10 is electrically connected to the sub-pixels 410 through a gate scanning signal line GL.

For example, the gate driving circuit is configured to drive a display panel such as a liquid crystal display panel, an organic light-emitting diode display panel, etc., and to sequentially provide gate scanning signals for a plurality of gate scanning signal lines of the display panel, so as to perform progressive scanning or interlaced scanning while the display panel displays one frame of pattern.

Figure 3A:
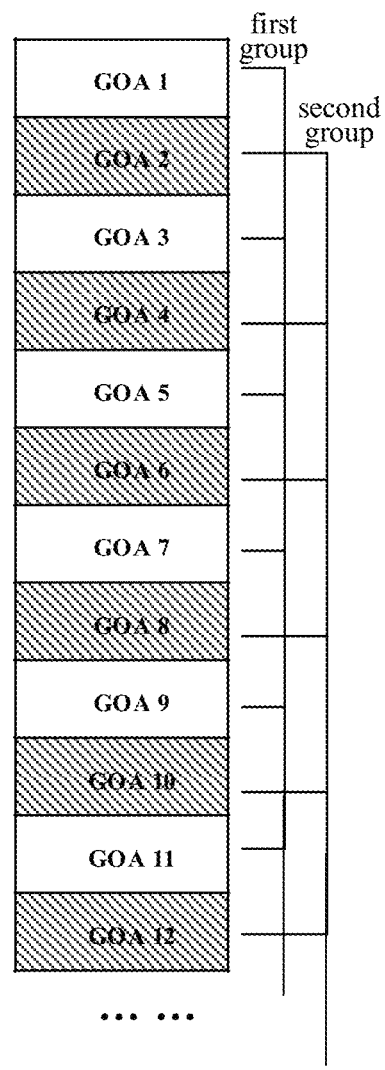
FIG. 3A is a schematic diagram of a gate driving circuit provided by at least one embodiment of the present disclosure.
Figure 3B:
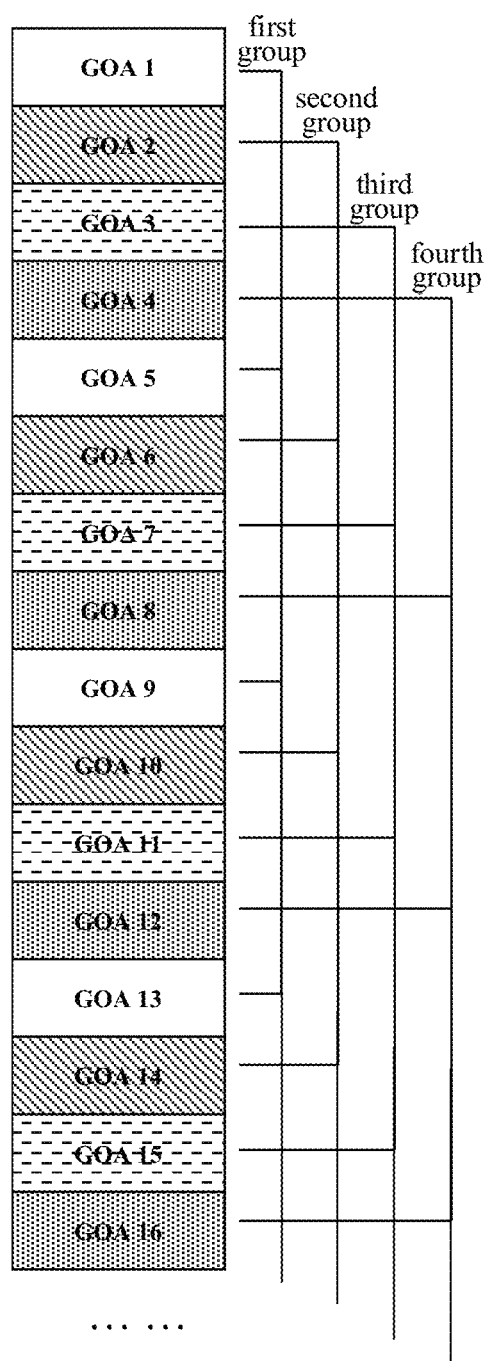
FIG. 3B is a schematic diagram of another gate driving circuit provided by at least one embodiment of the present disclosure.

FIG. 3A is a schematic diagram of a gate driving circuit provided by at least one embodiment of the present disclosure; FIG. 3B is a schematic diagram of another gate driving circuit provided by at least one embodiment of the present disclosure. The gate driving circuit provided by the embodiment of the present disclosure is described in detail below with reference to FIG. 3A and FIG. 3B.

For example, as shown in FIG. 3A and FIG. 3B, the gate driving circuit 10 includes shift registers of the plurality of stages arranged in sequence. For example, as shown in FIG. 3A and FIG. 3B, the shift registers of the plurality of stages arranged in sequence include a shift register of a first stage GOA1, a shift register of a second stage GOA2, a shift register of a third stage GOA3, . . . , etc., which are cascaded in sequence. For example, for a display panel with an 8K resolution, the shift registers of the plurality of stages arranged in sequence include a shift register of a first stage GOA1, a shift register of a second stage GOA2, a shift register of a third stage GOA3, . . . , a shift register of a 4320-th stage, a shift register of a 4322-th stage, a shift register of a 4324-th stage, or shift registers of more stages, etc., which are not limited by the embodiments of the present disclosure.

It should be noted that, for the sake of clarity and conciseness, only shift registers of 12 stages arranged in sequence are shown in FIG. 3A, and only shift registers of 16 stages arranged in sequence are shown in FIG. 3B; of course, shift registers of more stages cascaded in sequence may also be included, which is not limited in the embodiments of the present disclosure; and cascading mode may refer to the cascading mode described below, which is not repeated here. The number of stages of the shift registers is only exemplary, and may be determined according to the actual situation, which is not limited by the embodiments of the present disclosure.

For example, the shift registers of the plurality of stages arranged in sequence are combined into N groups of gate driving sub-circuits, and shift registers in the N groups of gate driving sub-circuits are cascaded, respectively. For example, in some examples, as shown in FIG. 3A, the shift registers of the plurality of stages arranged in sequence are combined into 2 (N=2) groups of gate driving sub-circuits, that is, a first group of gate driving sub-circuits and a second group of gate driving sub-circuits. For example, in other examples, as shown in FIG. 3B, the shift registers of the plurality of stages arranged in sequence are combined into 4 (N=4) groups of gate driving sub-circuits, that is, a first group of gate driving sub-circuits, a second group of gate driving sub-circuits, a third group of gate driving sub-circuits, and a fourth group of gate driving sub-circuits.

For example, an m-th group of gate driving sub-circuits in the N groups of gate driving sub-circuits comprises a shift register of an m-th stage and a shift register of an (m+L*N)-th stage that are cascaded, where m is an integer that is greater than or equal to 1 and less than or equal to N, L is an integer that is greater than or equal to 1, and N is an even number that is greater than or equal to 2.

The gate driving circuits shown in FIG. 3A and FIG. 3B are taken as examples for description below, that is, N=2 (including 2 groups of gate driving sub-circuits) and N=4 (including 4 groups of gate driving sub-circuits) are taken as examples to illustrate, and which are not limited in the embodiments of the present disclosure.

For example, as shown in FIG. 3A, when N=2, the first group of gate driving sub-circuits (ie, when m=1) includes shift registers of odd-numbered stages that are cascaded, for example, the shift registers of odd-numbered stages that are cascaded (white rectangle shown in FIG. 3A) include shift registers of first (m), third (L=1, m+L*N=3), fifth (L=2, m+L*N=5), seventh (L=3, m+L*N=7), ninth (L=4, m+L*N=9), eleventh (L=5, m+L*N=11) . . . stages that are cascaded (GOA1, GOA3, GOA5, GOA7, GOA9, GOA11 . . . ); the second group of gate driving sub-circuits (ie, when m=2) includes shift registers of even-numbered stages that are cascaded, for example, the shift registers of even-numbered stages that are cascaded (shaded rectangles shown in FIG. 3A) include shift registers of second (m), fourth (L=1, m+L*N=4), sixth (L=2, m+L*N=6)), eighth (L=3, m+L*N=8), tenth (L=4, m+L*N=10), twelfth (L=5, m+L*N=12) . . . stages that are cascaded (GOA2, GOA4, GOA6, GOA8, GOA10, GOA12 . . . ); which are not limited in the embodiments of the present disclosure.

For example, as shown in FIG. 3B, when N=4, the first group of gate driving sub-circuits (ie, when m=1) includes shift registers of odd-numbered stages that are cascaded, for example, the shift registers of odd-numbered stages that are cascaded include shift registers of 1st, 5th, 9th, 13th . . . stages that are cascaded (GOA1, GOA5, GOA9, GOA13 . . . ); the second group of gate driving sub-circuits (ie, when m=2) includes shift registers of even-numbered stages that are cascaded, for example, the shift registers of even-numbered stages that are cascaded include shift registers of 2nd, 6th, 10th, 14th . . . stages that are cascaded (GOA2, GOA6, GOA10, GOA14 . . . ); the third group of gate driving sub-circuits (ie, when m=3) includes shift registers of odd-numbered stages that are cascaded, for example, the shift registers of odd-numbered stages that are cascaded include shift registers of 3rd, 7th, 11th, 15th . . . stages that are cascaded (GOA3, GOA7, GOA11, GOA15 . . . ); the forth group of gate driving sub-circuits (ie, when m=4) includes shift registers of even-numbered stages that are cascaded, for example, the shift registers of even-numbered stages that are cascaded include shift registers of 4nd, 8th, 12th, 16th . . . stages that are cascaded (GOA4, GOA8, GOA12, GOA16 . . . ); which are not limited in the embodiments of the present disclosure.

For example, as described above, odd-numbered groups of gate driving sub-circuits (eg, the first group of gate driving sub-circuits as shown in FIG. 3A or the first group of gate driving sub-circuits and the third group of gate driving sub-circuits as shown in FIG. 3B include shift registers of odd-numbered stages that are cascaded) include shift registers of odd-numbered stages that are cascaded; even-numbered groups of gate driving sub-circuits (eg, the second group of gate driving sub-circuits as shown in FIG. 3A or the second group of gate driving sub-circuits and the fourth group of gate driving sub-circuits as shown in FIG. 3B include shift registers of even-numbered stages that are cascaded) include shift registers of even-numbered stages that are cascaded. For example, shift registers in each group of gate driving sub-circuits are cascaded respectively, and form a separate cascade relationship respectively; the gate driving sub-circuits of each group are not cascaded with each other, so that the odd-numbered rows of sub-pixels can be independently driven when odd-numbered frames are displayed, or the even-numbered rows of sub-pixels may be independently driven when even-numbered frames are displayed.

For example, the display panel 1 further includes N trigger signal lines, which are connected to the N groups of gate driving sub-circuits, respectively.

For example, in some examples, as shown in FIG. 3A, when the shift registers of the plurality of stages arranged in sequence are combined into 2 groups of gate driving sub-circuits (ie, the first group of gate driving sub-circuits and the second group of gate driving sub-circuits), the display panel includes 2 trigger signal lines connected with 2 groups of gate driving sub-circuits, respectively. For example, in other examples, as shown in FIG. 3B, when the shift registers of the plurality of stages arranged in sequence are combined into 4 groups of gate driving sub-circuits (ie, the first group of gate driving sub-circuits, the second group of gate driving sub-circuits, the third group of gate driving sub-circuits and the fourth group of gate driving sub-circuits), the display panel includes 4 trigger signal lines connected with 4 groups of gate driving sub-circuits, respectively.

For example, an m-th trigger signal line in the N trigger signal lines is connected to an input terminal (Input) of the shift register of the m-th stage. That is, the first trigger signal line STV1 is connected to an input terminal (Input) of the shift register of first stage in the first group of gate driving sub-circuits; the second trigger signal line STV2 is connected to an input terminal (Input) of the shift register of second stage (ie, the first shift register of the second group of gate driving sub-circuits); the third trigger signal line STV3 is connected to an input terminal (Input) of the shift register of third stage (ie, the first shift register of the third group of gate driving sub-circuits); the fourth trigger signal line STV4 is connected to an input terminal (Input) of the shift register of fourth stage (ie, the first shift register of the fourth group of gate driving sub-circuits).

It should be noted that in addition to connecting the shift registers of the first stage in each group of gate driving sub-circuits, each trigger signal line may also be connected to shift registers of other stages, which may be determined according to the actual situation, and specifically, which may be set according to the number of clock signal lines, and the specific connection relationship may refer to the design in the art, which is not repeated here.

The following description will be given by taking the display panel including two groups of gate driving sub-circuits and two trigger signal lines (the first trigger signal line STV1 and the second trigger signal line STV2) as an example, which is not limited by the embodiments of the present disclosure. The connection relationships of other groups of gate driving sub-circuits are similar to this, and are not repeated here.

For example, in some examples, the display panel further includes 4K clock signal lines. For example, the 4K clock signal lines comprise a first clock signal line to a 4K-th clock signal line, which are connected to clock signal terminals of the multi-stage shift registers, respectively, to provide clock signals, where K is an integer that is greater than or equal to 1, and 4K is less than or equal to the number of stages of the shift registers of the plurality of stages. For example, K may be equal to 1, 2, 3, 4, 5, etc. For example, the number of clock signal lines is an integer multiple of 4, such as 4CLK (4 clock signal lines, K=1), 8CLK (8 clock signal lines, K=2), 12CLK (12 clock signal lines, K=3), 16CLK (16 clock signal lines, K=4), etc., which are not limited in the embodiments of the present disclosure.

Figure 4:
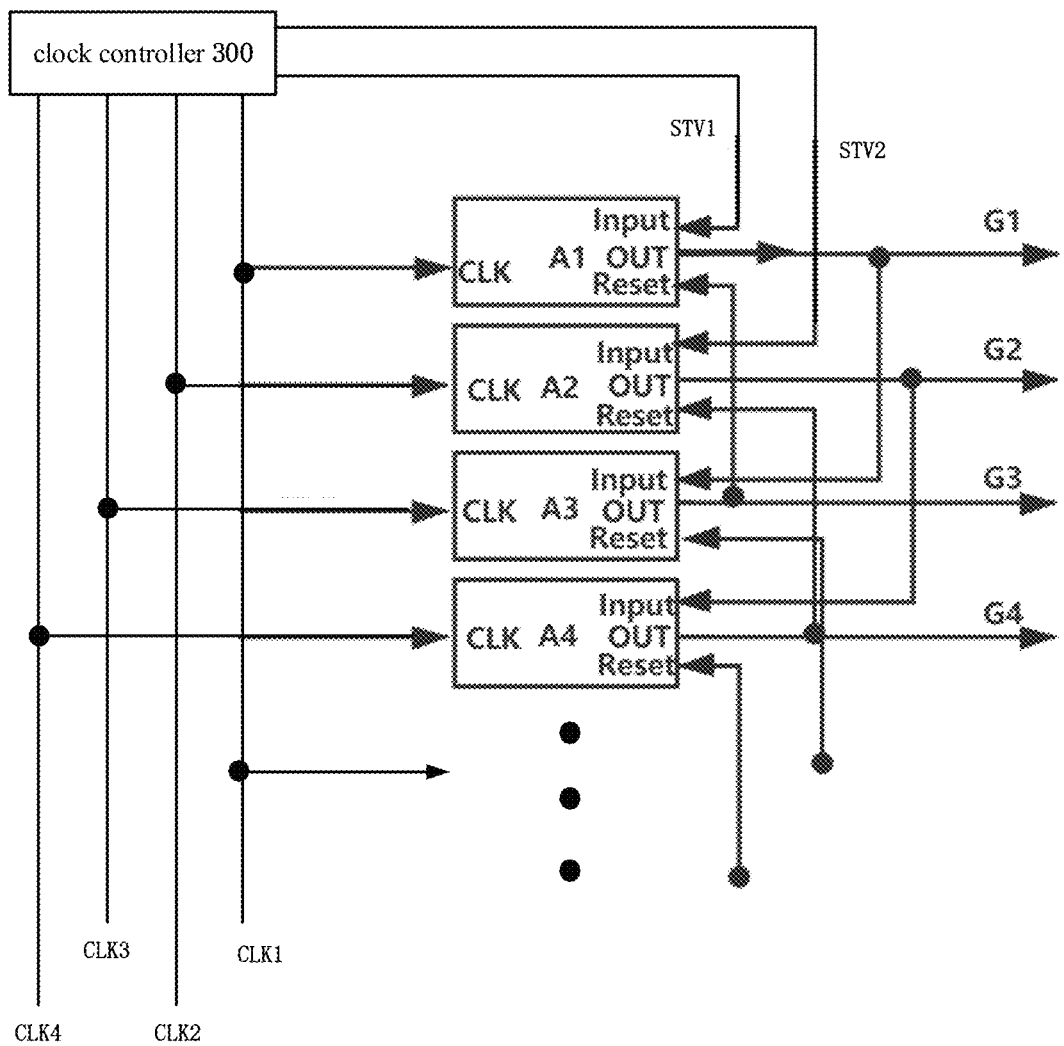
FIG. 4 is a schematic diagram of a display panel including 4CLK (K=1) provided by at least one embodiment of the present disclosure.
Figure 5:
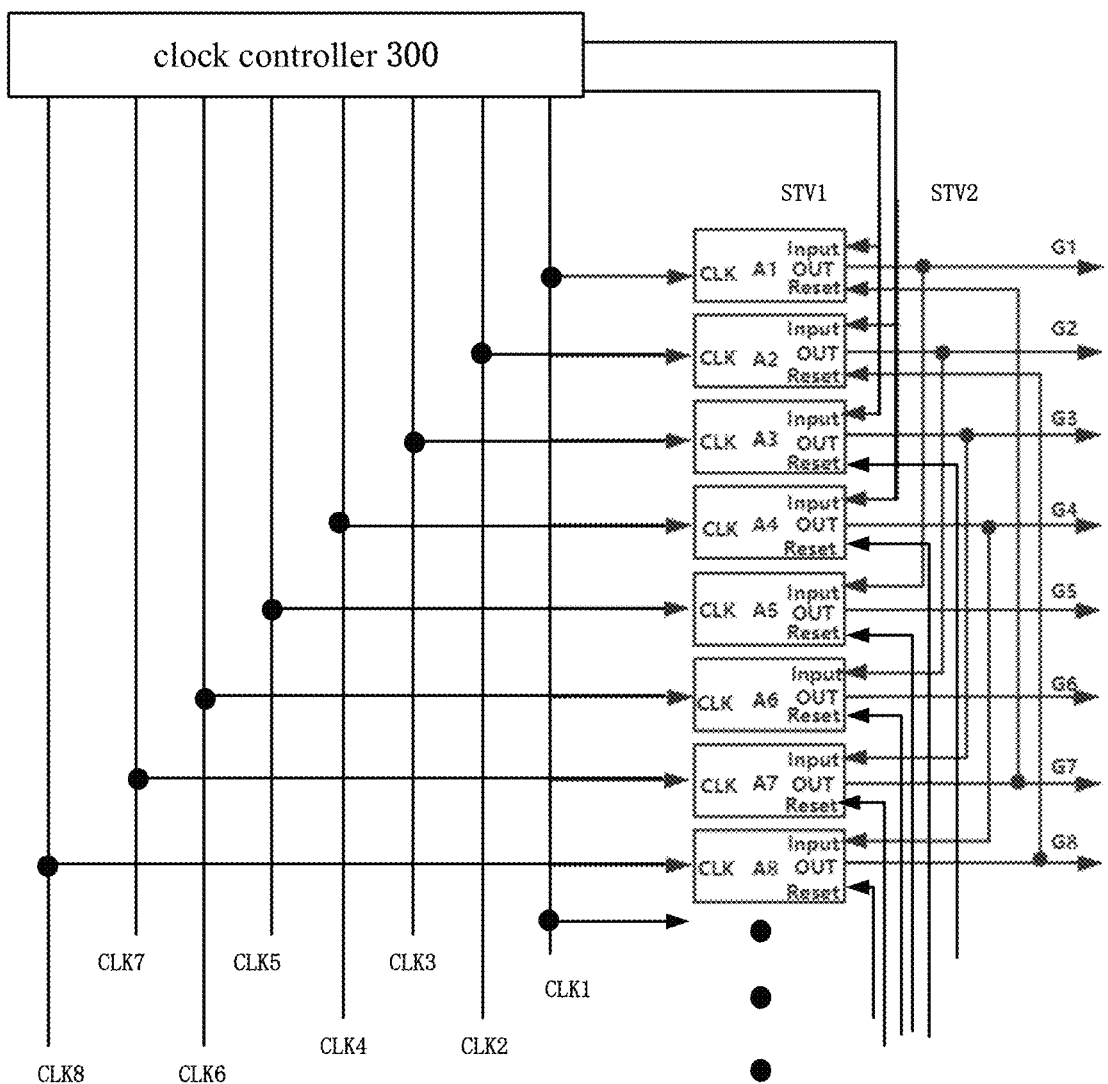
FIG. 5 is a schematic diagram of a display panel including 8CLK (K=2) provided by at least one embodiment of the present disclosure.
Figure 6A:
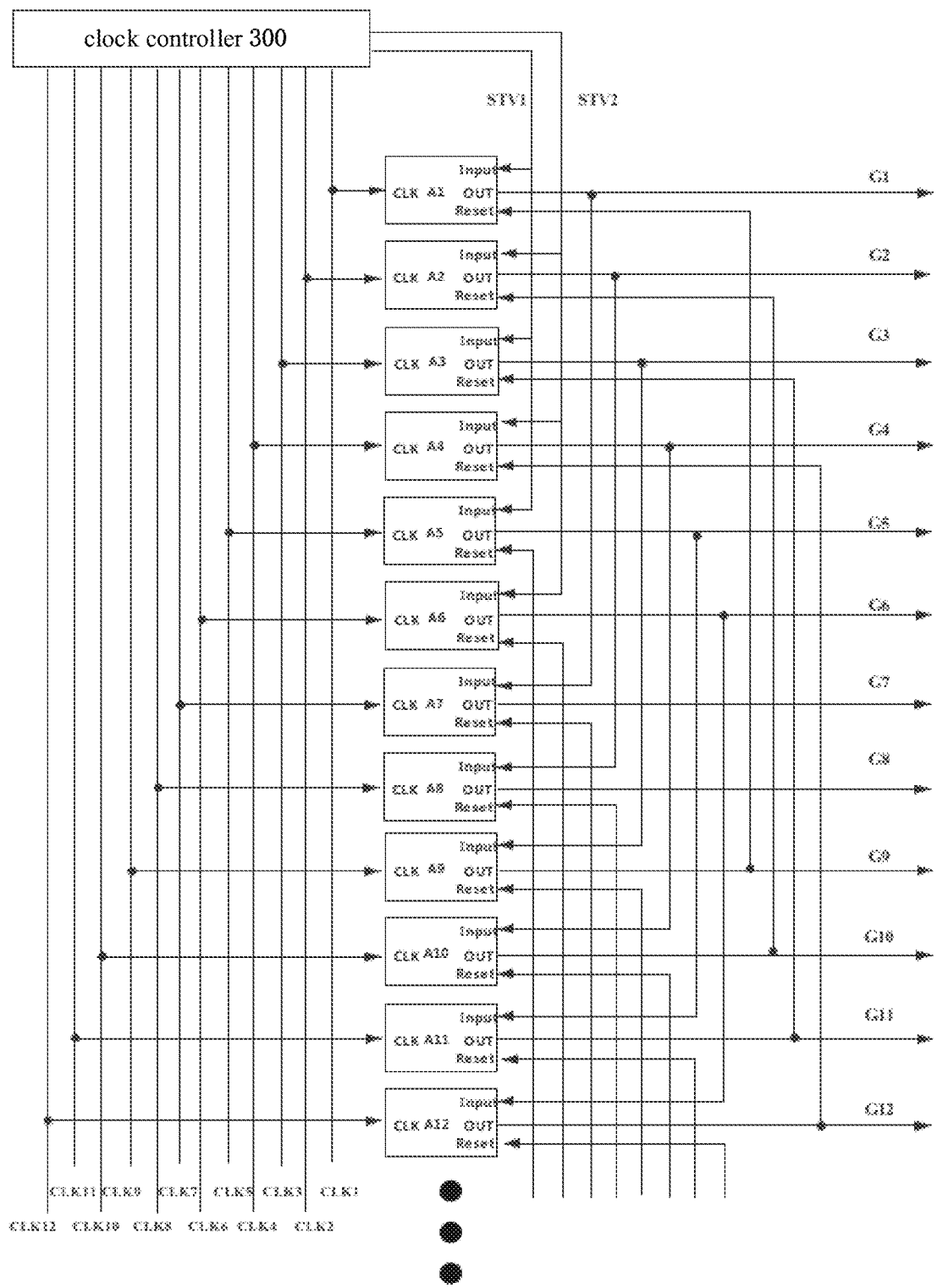
FIG. 6A is a schematic diagram of a display panel including 12CLK (K=3) provided by at least one embodiment of the present disclosure.
Figure 6B:
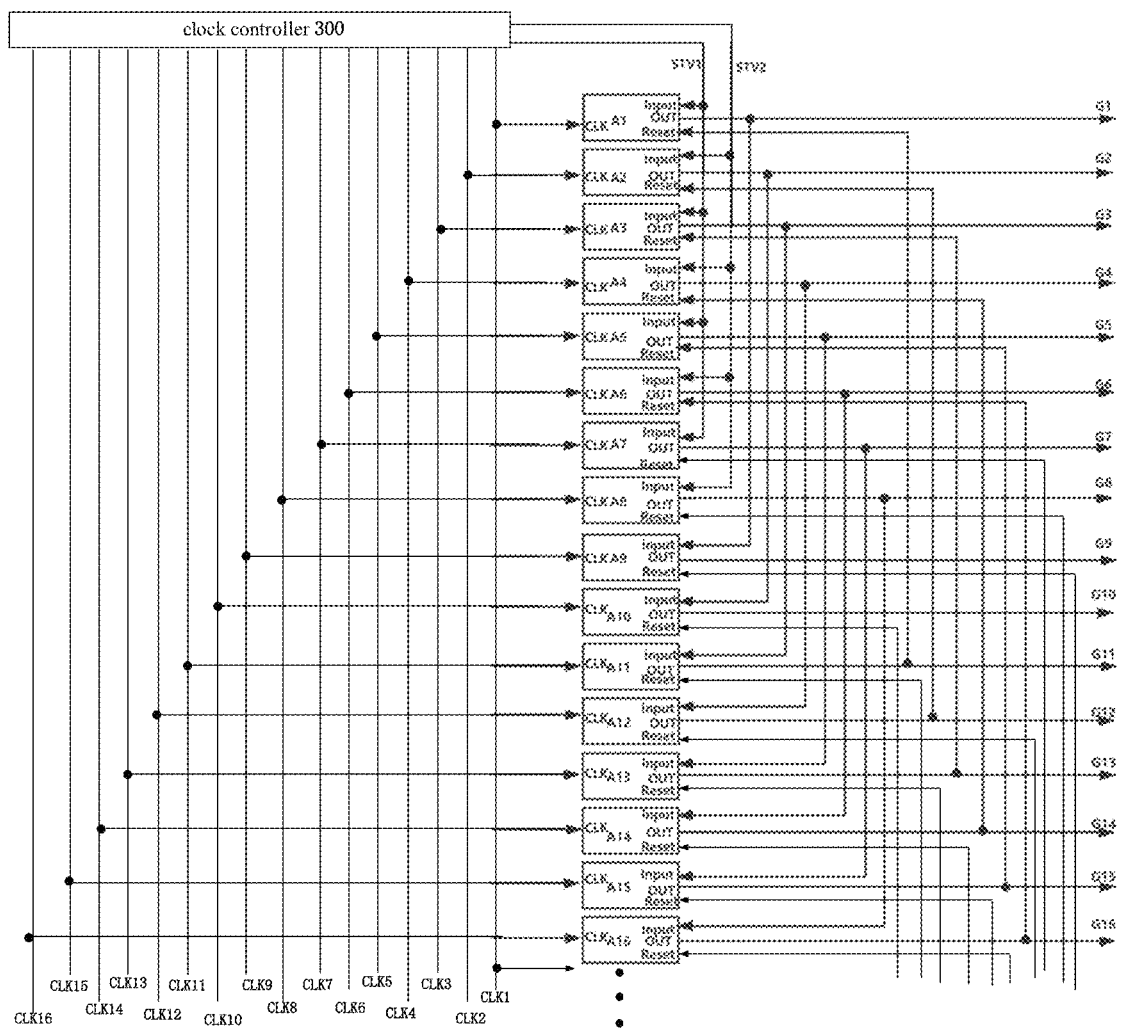
FIG. 6B is a schematic diagram of a display panel including 16CLK (K=4) provided by at least one embodiment of the present disclosure.

FIG. 4 is a schematic diagram of a display panel including 4CLK (K=1) provided by at least one embodiment of the present disclosure; FIG. 5 is a schematic diagram of a display panel including 8CLK (K=2) provided by at least one embodiment of the present disclosure; FIG. 6A is a schematic diagram of a display panel including 12CLK (K=3) provided by at least one embodiment of the present disclosure; FIG. 6B is a schematic diagram of a display panel including 16CLK (K=4) provided by at least one embodiment of the present disclosure.

For example, when K=1, as shown in FIG. 4, the 4K clock signal lines include a first clock signal line CLK1, a second clock signal line CLK2, a third clock signal line CLK3 and a fourth clock signal line CLK4.

For example, as shown in FIG. 4, the first clock signal line CLK1 is connected to a clock signal terminal CLK of a shift register of a (4n−3)th (n is an integer greater than or equal to 1) stage; the second clock signal line CLK2 is connected to a clock signal terminal CLK of a shift register of a (4n−2)th stage; the third clock signal line CLK3 is connected to a clock signal terminal CLK of a shift register of a (4n−1)th stage; and the fourth clock signal line CLK4 is connected to a clock signal terminal CLK of a shift register of 4n-th stage.

For example, when K=3, as shown in FIG. 6A, the 4K clock signal lines include a first clock signal line CLK1, a second clock signal line CLK2, a third clock signal line CLK3, a fourth clock signal line CLK4, a fifth clock signal line CLK5, a sixth clock signal line CLK6, a seventh clock signal line CLK7, an eighth clock signal line CLK8, a ninth clock signal line CLK9, a tenth clock signal line CLK10, an eleventh clock signal line CLK11, a twelfth clock signal line CLK12.

For example, as shown in FIG. 6A, the first clock signal line CLK1 is connected to a clock signal terminal of a shift register of a (12n−11)th stage; the second clock signal line CLK2 is connected to a clock signal terminal of a shift register of a (12n−10)th stage; the third clock signal line CLK3 is connected to a clock signal terminal of a shift register of a (12n−9)th stage; the fourth clock signal line CLK4 is connected to a clock signal terminal of a shift register of a (12n−8)th stage; the fifth clock signal line CLK5 is connected to a clock signal terminal of a shift register of a (12n−7)th stage; the sixth clock signal line CLK6 is connected to a clock signal terminal of a shift register of a (12n−6)th stage; the seventh clock signal line CLK7 is connected to a clock signal terminal of a shift register of a (12n−5)th stage; the eighth clock signal line CLK8 is connected to a clock signal terminal of a shift register of a (12n−4)th stage; the ninth clock signal line CLK9 is connected to a clock signal terminal of a shift register of a (12n−3)th stage; the tenth clock signal line CLK10 is connected to a clock signal terminal of a shift register of a (12n−2)th stage; the eleventh clock signal line CLK11 is connected to a clock signal terminal of a shift register of a (12n−1)th stage; and the twelfth clock signal line CLK12 is connected to a clock signal terminal of a shift register of a 12n-th stage; n is an integer greater that is than or equal to 1.

It should be noted that the connection modes between other numbers of clock signal lines and the shift register unit are similar to that in FIG. 4 and FIG. 6A, which will not be repeated here; of course, other connection modes may also be used, which are not limited by the embodiments of the present disclosure.

For example, as shown in FIG. 4-FIG. 6B, when N=2, the N trigger signal lines include a first trigger signal line STV1 and a second trigger signal line STV2.

For example, the first trigger signal line STV1 is connected to input terminals (Input) of shift registers of first K odd-numbered stages to provide a first trigger signal, and input terminals (Input) of shift registers of remaining odd-numbered stages are respectively connected to output terminals (OUT) of shift registers of preceding stages that are respectively separated by K−1 odd-numbered stages or connected to output terminals (OUT) of shift registers of preceding stages that are respectively separated by 2K−1 stages; the second trigger signal line STV2 is connected to input terminals of shift registers of first K even-numbered stages to provide a second trigger signal, and input terminals of shift registers of remaining even-numbered stages are respectively connected to output terminals of shift registers of preceding stages that are respectively separated by K−1 even-numbered stages or connected to output terminals (OUT) of shift registers of preceding stages that are respectively separated by 2K−1 stages.

For example, as shown in FIG. 4, when four (K=1) clock signal lines are included, for the first group of gate driving sub-circuits, the first trigger signal line STV1 is connected to input terminal (Input) of shift registers of first 1 odd-numbered stage (ie, shift register A1 of the first stage) to provide the first trigger signal, and input terminals (Input) of shift registers of remaining odd-numbered stages are respectively connected to output terminals (OUT) of shift registers of preceding stages that are respectively separated by 0 odd-numbered stage (ie, connected to the output terminal (OUT) of the adjacent shift register of preceding odd-numbered stage) or connected to output terminals (OUT) of shift registers of preceding stages that are respectively separated by 1 stage. For example, the shift registers of remaining odd-numbered stages are described by taking shift register of the third stage as an example, which is not limited in the embodiments of the present disclosure. For example, input terminals (Input) of the shift register of the third stage is connected to output terminals (OUT) of adjacent shift register (ie, shift register A1 of the first stage) of preceding odd-numbered stage or connected to output terminals (OUT) of shift registers (ie, shift register A1 of the first stage) of preceding stages that are respectively separated by 1 stage (ie, separated by shift register A2 of the second stage).

For example, as shown in FIG. 4, when four (K=1) clock signal lines are included, for the second group of gate driving sub-circuits, the second trigger signal line STV2 is connected to input terminal (Input) of shift register of first 1 even-numbered stage (ie, shift register A2 of the second stage) to provide the second trigger signal, and input terminals (Input) of shift registers of remaining even-numbered stages are respectively connected to output terminals (OUT) of shift registers of preceding stages that are respectively separated by 0 even-numbered stage (ie, connected to the output terminals (OUT) of the adjacent shift register of preceding even-numbered stage) or connected to output terminals (OUT) of shift registers of preceding stages that are respectively separated by 1 stage. For example, the shift registers of remaining even-numbered stages are described by taking shift register of the fourth stage as an example, which is not limited in the embodiments of the present disclosure. For example, input terminal (Input) of the shift register of the fourth stage is connected to output terminal (OUT) of adjacent shift register (ie, shift register A2 of the second stage) of preceding even-numbered stage or connected to output terminal (OUT) of shift register (ie, shift register A2 of the second stage) of preceding stages that are respectively separated by 1 stage (ie, separated by shift register A3 of the third stage).

For example, as shown in FIG. 5, when eight (K=2) clock signal lines are included, for the first group of gate driving sub-circuits, the first trigger signal line STV1 is connected to input terminals (Input) of shift registers of first 2 odd-numbered stages (ie, shift register A1 of the first stage and shift register A3 of the third stage) to provide the first trigger signal, and input terminals (Input) of shift registers of remaining odd-numbered stages are respectively connected to output terminals (OUT) of shift registers of preceding stages that are respectively separated by 1 odd-numbered stage or connected to output terminals (OUT) of shift registers of preceding stages that are respectively separated by 3 stages. For example, the shift registers of remaining odd-numbered stages are described by taking shift register of the fifth stage as an example, which is not limited in the embodiments of the present disclosure. For example, input terminal (Input) of the shift register of the fifth stage is connected to output terminals (OUT) of shift registers (ie, shift register A1 of the first stage) of preceding stages that are respectively separated by 1 odd-numbered stage (ie, shift register A3 of the third stage) or connected to output terminals (OUT) of shift registers (ie, shift register A1 of the first stage) of preceding stages that are respectively separated by 3 stages (ie, separated by shift register A2 of the second stage, shift register A3 of the third stage and shift register A4 of the fourth stage).

For example, as shown in FIG. 5, when eight (K=2) clock signal lines are included, for the second group of gate driving sub-circuits, the second trigger signal line STV2 is connected to input terminals (Input) of shift registers of first 2 even-numbered stages (ie, shift register A2 of the second stage and shift register A4 of the fourth stage) to provide the second trigger signal, and input terminals (Input) of shift registers of remaining even-numbered stages are respectively connected to output terminals (OUT) of shift registers of preceding stages that are respectively separated by 1 even-numbered stage or connected to output terminals (OUT) of shift registers of preceding stages that are respectively separated by 3 stages. For example, the shift registers of remaining even-numbered stages are described by taking shift register of the fifth stage as an example, which is not limited in the embodiments of the present disclosure. For example, input terminal (Input) of the shift register of the sixth stage is connected to output terminals (OUT) of shift registers (ie, shift register A2 of the second stage) of preceding stages that are respectively separated by 1 even-numbered stage (ie, shift register A4 of the fourth stage) or connected to output terminals (OUT) of shift registers (ie, shift register A2 of the second stage) of preceding stages that are respectively separated by 3 stages (ie, separated by shift register A3 of the third stage, shift register A4 of the fourth stage and shift register A5 of the fifth stage).

For example, as shown in FIG. 6A, when 12 (K=3) clock signal lines are included, for the first group of gate driving sub-circuits, the first trigger signal line STV1 is connected to input terminals (Input) of shift registers of first 3 odd-numbered stages (ie, shift register A1 of the first stage, shift register A3 of the third stage and shift register A5 of the fifth stage) to provide the first trigger signal, and input terminals (Input) of shift registers of remaining odd-numbered stages are respectively connected to output terminals (OUT) of shift registers of preceding stages that are respectively separated by 2 (K−1=2) odd-numbered stages or connected to output terminals (OUT) of shift registers of preceding stages that are respectively separated by 5 (2K−1=5) stages. For example, the shift registers of remaining odd-numbered stages are described by taking shift register of the seventh stage as an example, which is not limited in the embodiments of the present disclosure. For example, input terminal (Input) of the shift register of the seventh stage is connected to output terminals (OUT) of shift registers (ie, shift register A1 of the first stage) of preceding stages that are respectively separated by 3 odd-numbered stages (ie, shift register A3 of the third stage and shift register A5 of the fifth stage) or connected to output terminals (OUT) of shift registers (ie, shift register A1 of the first stage) of preceding stages that are respectively separated by 5 stages (ie, separated by shift register A2 of the second stage to shift register A6 of the sixth stage).

For example, as shown in FIG. 6A, when 12 (K=3) clock signal lines are included, for the second group of gate driving sub-circuits, the second trigger signal line STV2 is connected to input terminals (Input) of shift registers of first 3 even-numbered stages (ie, shift register A2 of the second stage, shift register A4 of the fourth stage and shift register A6 of the sixth stage) to provide the second trigger signal, and input terminals (Input) of shift registers of remaining even-numbered stages are respectively connected to output terminals (OUT) of shift registers of preceding stages that are respectively separated by 2 even-numbered stages or connected to output terminals (OUT) of shift registers of preceding stages that are respectively separated by 5 stages. For example, the shift registers of remaining even-numbered stages are described by taking shift register of the eighth stage as an example, which is not limited in the embodiments of the present disclosure. For example, input terminal (Input) of the shift register of the eighth stage is connected to output terminals (OUT) of shift registers (ie, shift register A2 of the second stage) of preceding stages that are respectively separated by 2 even-numbered stages (ie, shift register A4 of the fourth stage and shift register A6 of the sixth stage) or connected to output terminals (OUT) of shift registers (ie, shift register A2 of the second stage) of preceding stages that are respectively separated by 5 stages (ie, separated by shift register A3 of the third stage to shift register A7 of the seventh stage).

For example, as shown in FIG. 6B, when 16 (K=4) clock signal lines are included, for the first group of gate driving sub-circuits, the first trigger signal line STV1 is connected to input terminals (Input) of shift registers of first 4 odd-numbered stages (ie, shift register A1 of the first stage, shift register A3 of the third stage, shift register A5 of the fifth stage and shift register A7 of the seventh stage) to provide the first trigger signal, and input terminals (Input) of shift registers of remaining odd-numbered stages are respectively connected to output terminals (OUT) of shift registers of preceding stages that are respectively separated by 3 odd-numbered stages or connected to output terminals (OUT) of shift registers of preceding stages that are respectively separated by 7 stages. For example, the shift registers of remaining odd-numbered stages are described by taking shift register of the ninth stage as an example, which is not limited in the embodiments of the present disclosure. For example, input terminals (Input) of the shift register of the ninth stage is connected to output terminals (OUT) of shift registers (ie, shift register A1 of the first stage) of preceding stages that are respectively separated by 3 odd-numbered stages (ie, shift register A3 of the third stage, shift register A5 of the fifth stage and shift register A7 of the seventh stage) or connected to output terminals (OUT) of shift registers (ie, shift register A1 of the first stage) of preceding stages that are respectively separated by 7 stages (ie, separated by shift register A2 of the second stage to shift register A8 of the eighth stage).

For example, as shown in FIG. 6B, when 16 (K=4) clock signal lines are included, for the second group of gate driving sub-circuits, the second trigger signal line STV2 is connected to input terminals (Input) of shift registers of first 4 even-numbered stages (ie, shift register A2 of the second stage, shift register A4 of the fourth stage, shift register A6 of the sixth stage and shift register A8 of the eighth stage) to provide the second trigger signal, and input terminals (Input) of shift registers of remaining even-numbered stages are respectively connected to output terminals (OUT) of shift registers of preceding stages that are respectively separated by 3 even-numbered stages or connected to output terminals (OUT) of shift registers of preceding stages that are respectively separated by 7 stages. For example, the shift registers of remaining even-numbered stages are described by taking shift register of the tenth stage as an example, which is not limited in the embodiments of the present disclosure. For example, an input terminal (Input) of the shift register of the tenth stage is connected to output terminals (OUT) of shift registers (ie, shift register A2 of the second stage) of preceding stages that are respectively separated by 3 even-numbered stages (ie, shift register A4 of the fourth stage, shift register A6 of the sixth stage and shift register A8 of the eighth stage) or connected to output terminals (OUT) of shift registers (ie, shift register A2 of the second stage) of preceding stages that are respectively separated by 7 stages (ie, separated by shift register A3 of the third stage to shift register A9 of the ninth stage).

For example, in the examples shown in FIG. 4 and FIG. 5, when K=1 or 2, except for shift registers of the last K odd-numbered stages, a reset terminal (Reset) of shift register of the each of remaining odd-numbered stages is connected to output terminal (OUT) of shift register of succeeding stage separated by shift registers of 2K−2 odd-numbered stages, or connected to output terminal (OUT) of shift register of succeeding stage separated by shift registers of 4K−3 stages; except for shift registers of the last K even-numbered stages, reset terminal (Reset) of shift register of each of remaining even-numbered stages is connected to the output terminal (OUT) of the shift register of succeeding stage separated by shift registers of 2K−2 even-numbered stages, or connected to the output terminal (OUT) of shift register of succeeding stage separated by shift registers of 4K−3 stages.

For example, as shown in FIG. 4, when four (K=1) clock signal lines are included, except for shift register of the last 1 odd-numbered stage, reset terminal (Reset) of shift registers of the each of remaining odd-numbered stages is connected to output terminal (OUT) of shift register of succeeding stage separated by shift register of 0 odd-numbered stage, or connected to output terminal (OUT) of shift register of succeeding stage separated by shift register of 1 stage. For example, the shift registers of remaining odd-numbered stages are described by taking shift register of the first stage as an example, which is not limited in the embodiments of the present disclosure. For example, a reset terminal (Reset) of shift register A1 of the first stage is connected to output terminal (OUT) of shift register (ie, shift register A3 of the third stage) of succeeding stage separated by shift register of 0 odd-numbered stage, or connected to output terminal (OUT) of shift register (ie, shift register A3 of the third stage) of succeeding stage separated by the shift register of 1 stage (ie, the shift register A2 of the second stage).

For example, as shown in FIG. 4, when four (K=1) clock signal lines are included, except for shift register of the last 1 even-numbered stage, reset terminal (Reset) of shift registers of the each of remaining even-numbered stages is connected to output terminal (OUT) of shift register of succeeding stage separated by shift register of 0 even-numbered stage, or connected to output terminal (OUT) of shift register of succeeding stage separated by shift register of 1 stage. For example, the shift registers of remaining even-numbered stages are described by taking shift register of the second stage as an example, which is not limited in the embodiments of the present disclosure. For example, the reset terminal (Reset) of shift register A2 of the second stage is connected to the output terminal (OUT) of shift register (ie, shift register A4 of the fourth stage) of succeeding stage separated by shift register of 0 even-numbered stage, or connected to the output terminal (OUT) of the shift register (ie, the shift register A4 of the fourth stage) of succeeding stage separated by the shift register of 1 stage (ie, shift register A3 of the third stage).

For example, as shown in FIG. 5, when 8 (K=2) clock signal rows are included, except for shift registers of the last 2 odd-numbered stages, the reset terminal (Reset) of shift registers of the each of remaining odd-numbered stages is connected to the output terminal (OUT) of shift register of succeeding stage separated by shift register of 2 odd-numbered stages, or connected to the output terminal (OUT) of the shift register of succeeding stage separated by shift registers of 5 stages. For example, the shift registers of remaining odd-numbered stages are described by taking the shift register of the first stage as an example, which is not limited in the embodiments of the present disclosure. For example, the reset terminal (Reset) of the shift register A1 of the first stage is connected to the output terminal (OUT) of the shift register (ie, the shift register A7 of the seventh stage) of succeeding stage separated by shift register of 2 odd-numbered stages (ie, separated by shift register A2 of the second stage to shift register A6 of the sixth stage), or connected to the output terminal (OUT) of the shift register (ie, the shift register A7 of the seventh stage) of succeeding stage separated by shift register of 5 stage (ie, the shift register A2 of the second stage to the shift register A6 of the sixth stage).

For example, as shown in FIG. 5, when 8 (K=2) clock signal rows are included, except for shift registers of the last 2 even-numbered stages, the reset terminal (Reset) of shift registers of the each of remaining even-numbered stages is connected to the output terminal (OUT) of the shift register of succeeding stage separated by shift register of 2 even-numbered stages, or connected to the output terminal (OUT) of the shift register of succeeding stage separated by shift registers of 5 stages. For example, the shift registers of remaining odd-numbered stages are described by taking the shift register of the second stage as an example, which is not limited in the embodiments of the present disclosure. For example, the reset terminal (Reset) of the shift register A2 of the second stage is connected to the output terminal (OUT) of the shift register (ie, the shift register A8 of the eighth stage) of succeeding stage separated by shift register of 2 even-numbered stages (ie, separated by the shift register A4 of the fourth stage and the shift register A6 of the sixth stage), or connected to the output terminal (OUT) of shift register (ie, the shift register A8 of the eighth stage) of succeeding stage separated by the shift register of 5 stage (ie, separated by the shift register A3 of the third stage to the shift register A7 of the seventh stage).

For example, in other examples, when K=3 (ie, including 12 clock signal lines as shown in FIG. 6A) or 4 (ie, including 16 clock signal lines as shown in FIG. 6B), for example, in the example shown in FIG. 6A, except for shift registers of the last K odd-numbered stages, the reset terminal (Reset) of shift register of the each of remaining odd-numbered stages is connected to the output terminal (OUT) of shift register of succeeding stage separated by shift registers of K odd-numbered stages, or connected to the output terminal (OUT) of shift register of succeeding stage separated by shift registers of 2K+1 stages; except for shift registers of the last K even-numbered stages, the reset terminal (Reset) of the shift register of each of remaining even-numbered stages is connected to the output terminal (OUT) of the shift register of succeeding stage separated by shift registers of K even-numbered stages, or connected to the output terminal (OUT) of the shift register of succeeding stage separated by shift registers of 2K+1 stages; for example, in the example shown in FIG. 6B, except for shift registers of the last K odd-numbered stages, the reset terminal (Reset) of the shift register of the each of remaining odd-numbered stages is connected to the output terminal (OUT) of the shift register of succeeding stage separated by shift registers of K odd-numbered stages, or connected to the output terminal (OUT) of the shift register of succeeding stage separated by shift registers of 2K+1 stages; except for shift registers of the last K even-numbered stages, the reset terminal (Reset) of the shift register of each of remaining even-numbered stages is connected to the output terminal (OUT) of the shift register of succeeding stage separated by shift registers of K even-numbered stages, or connected to the output terminal (OUT) of the shift register of succeeding stage separated by shift registers of 2K+1 stages.

For example, as shown in FIG. 6A, when 12 (K=3) clock signal lines are included, except for shift registers of the last 3 odd-numbered stages, the reset terminal (Reset) of shift registers of the each of remaining odd-numbered stages is connected to the output terminal (OUT) of the shift register of succeeding stage separated by shift register of 3(K=3) odd-numbered stages, or connected to the output terminal (OUT) of the shift register of succeeding stage separated by shift registers of 7 (2K+1=7) stages. For example, the shift registers of remaining odd-numbered stages are described by taking shift register of the first stage as an example, which is not limited in the embodiments of the present disclosure. For example, the reset terminal (Reset) of the shift register A1 of the first stage is connected to the output terminal (OUT) of the shift register (ie, shift register A9 of the ninth stage) of succeeding stage separated by shift register of 4 odd-numbered stages (ie, separated by the shift register A3 of the third stage, the shift register A5 of the fifth stage and the shift register A7 of the seventh stage), or connected to the output terminal (OUT) of the shift register (ie, the shift register A9 of the ninth stage) of succeeding stage separated by the shift register of 7 stage (ie, the shift register A2 of the second stage to the shift register A8 of the eighth stage).

For example, as shown in FIG. 6A, when 12 (K=3) clock signal lines are included, except for shift registers of the last 3 even-numbered stages, the reset terminal (Reset) of shift registers of the each of remaining even-numbered stages is connected to the output terminal (OUT) of the shift register of succeeding stage separated by shift register of 3 even-numbered stages, or connected to the output terminal (OUT) of the shift register of succeeding stage separated by shift registers of 7 stages. For example, the shift registers of remaining odd-numbered stages are described by taking the shift register of the second stage as an example, which is not limited in the embodiments of the present disclosure. For example, the reset terminal (Reset) of the shift register A2 of the second stage is connected to the output terminal (OUT) of the shift register (ie, the shift register A10 of the tenth stage) of succeeding stage separated by the shift register of 3 even-numbered stages (ie, separated by the shift register A4 of the fourth stage, the shift register A6 of the sixth stage and the shift register A8 of the eighth stage), or connected to the output terminal (OUT) of the shift register (ie, the shift register A10 of the tenth stage) of succeeding stage separated by the shift register of 7 stage (ie, the shift register A3 of the third stage to the shift register A9 of the ninth stage).

For example, as shown in FIG. 6B, when 16 (K=4) clock signal lines are included, except for shift registers of the last 4 odd-numbered stages, the reset terminal (Reset) of shift registers of the each of remaining odd-numbered stages is connected to the output terminal (OUT) of shift register of succeeding stage separated by shift register of 4 odd-numbered stages, or connected to the output terminal (OUT) of the shift register of succeeding stage separated by shift registers of 9 stages. For example, the shift registers of remaining odd-numbered stages are described by taking shift register of the first stage as an example, which is not limited in the embodiments of the present disclosure. For example, the reset terminal (Reset) of the shift register A1 of the first stage is connected to the output terminal (OUT) of the shift register (ie, the shift register A11 of the 11th stage) of succeeding stage separated by the shift register of 4 odd-numbered stages (ie, separated by the shift register A3 of the third stage, the shift register A5 of the fifth stage, the shift register A7 of the seventh stage and the shift register A9 of the ninth stage), or connected to the output terminal (OUT) of the shift register (ie, the shift register A11 of the 11th stage) of succeeding stage separated by the shift register of 7 stage (ie, the shift register A2 of the second stage to shift register A10 of the tenth stage).

For example, as shown in FIG. 6B, when 16 (K=4) clock signal rows are included, except for shift registers of the last 4 even-numbered stages, the reset terminal (Reset) of the shift register of the each of remaining even-numbered stages is connected to the output terminal (OUT) of the shift register of succeeding stage separated by shift register of 4 even-numbered stages, or connected to the output terminal (OUT) of the shift register of succeeding stage separated by shift registers of 9 stages. For example, the shift registers of remaining odd-numbered stages are described by taking shift register of the second stage as an example, which is not limited in the embodiments of the present disclosure. For example, the reset terminal (Reset) of the shift register A2 of the second stage is connected to the output terminal (OUT) of the shift register (ie, the shift register A12 of the 12th stage) of succeeding stage separated by shift registers of 4 even-numbered stages (ie, separated by the shift register A4 of the fourth stage, the shift register A6 of the sixth stage, the shift register A8 of the eighth stage and the shift register A10 of the tenth stage), or connected to the output terminal (OUT) of the shift register (ie, the shift register A12 of the 12th stage) of succeeding stage separated by the shift register of 9 stage (ie, the shift register A3 of the third stage to the shift register A11 of the 11th stage).

For example, the reset terminals (Reset) shift registers of the last K (ie, K stages) odd-numbered stages are connected to a reset signal line (not shown in figures) to receive a reset signal.

For example, the shift registers of the plurality of stages arranged in sequence comprise a plurality of dummy shift registers, and input terminals of dummy shift registers of N stages in the plurality of dummy shift registers are respectively connected to the N trigger signal lines to receive trigger signals.

Due to factors such as the output of the shift register unit directly connected to the trigger signal line may not be stable enough, the shift register connected to the trigger signal line may be set as a dummy shift register. For example, the dummy register is not connected to sub-pixels or is connected to dummy sub-pixels, for example, the dummy sub-pixels are not used for emitting light, that is, no data signal is written.

For example, in the example of FIG. 4, a display with 8K resolution may include 4320 rows of sub-pixels and shift registers of 4322 stages connected to the 4320 rows of sub-pixels, in which the shift register A1 of the first stage connected to the first trigger signal line STV1 and the shift register A2 of the second stage connected to the second trigger signal line STV2 are not connected to the sub-pixels as dummy shift registers; a display with 8K resolution may include 4322 rows of sub-pixels and shift registers of 4322 stages connected to the 4322 rows of sub-pixels, in which 4320 rows (eg, the 3rd row to the 4320th row) of sub-pixels are used for display, and sub-pixels (connected to dummy shift registers of the 1st to 2nd stages) set in the remaining 2 rows (eg, the 1st and 2nd rows) are not used for display as dummy sub-pixels (eg, no data signal is input).

For example, in the example of FIG. 5, a display with 8K resolution may include 4320 rows of sub-pixels and shift registers of 4324 stages connected to the 4320 rows of sub-pixels, in which the shift register A1 of the first stage and shift register A3 of the third stage connected to the first trigger signal line STV1 and the shift register A2 of the second stage and the shift register A4 of the fourth stage connected to the second trigger signal line STV2 are not connected to the sub-pixels as dummy shift registers; a display with 8K resolution may include 4324 rows of sub-pixels and shift registers connected to the 4324 rows of sub-pixels, in which 4320 rows (eg, the 3rd row to the 4320th row) of sub-pixels are used for display, and sub-pixels (connected to dummy shift registers of the 1st to 4th stages) set in the remaining 4 rows (eg, the 1st to 4th rows) are not used for display as dummy sub-pixels (eg, no data signal is input).

For example, in the example of FIG. 6A, a display with 8K resolution may include 4320 rows of sub-pixels and shift registers of 4326 stages connected to the 4320 rows of sub-pixels, in which the shift register A1 of the first stage, shift register A3 of the third stage and shift register A5 of the fifth stage connected to the first trigger signal line STV1 and the shift register A2 of the second stage, the shift register A4 of the fourth stage and the shift register A6 of the sixth stage connected to the second trigger signal line STV2 are not connected to the sub-pixels as dummy shift registers; a display with 8K resolution may include 4326 rows of sub-pixels and shift registers connected to the 4326 rows of sub-pixels, in which 4320 rows (eg, the 7rd row to the 4320th row) of sub-pixels are used for display, and sub-pixels (connected to dummy shift registers of the 1st to 6th stages) set in the remaining 4 rows (eg, the 1st to 6th rows) are not used for display as dummy sub-pixels (eg, no data signal is input).

FIG. 6B is similar to FIG. 6A, the dummy shift registers included in the 8K resolution display are the shift register of the first stage to the shift register of the eighth stage; or the dummy sub-pixels included are from the 1st row to the 8th row, which will not be repeated here.

It should be noted that, according to actual needs, the number of dummy shift registers and the number of dummy sub-pixel rows may be more or less; FIG. 4-FIG. 6B only schematically show the corresponding numbers, which are not limited by the embodiments of the present disclosure.

The following description is given by taking an example where no dummy shift registers and dummy sub-pixels are set (that is, the gate scanning signal output by the shift registers of the plurality of stages connected to the trigger signal lines drive a plurality of rows of sub-pixels connected thereto for display), which is not limited by the embodiments of the present disclosure.

For example, as shown in FIG. 4-FIG. 6B, the display panel 1 further includes a clock controller 300, which is connected to the 4K clock signal lines and is configured to: upon providing clock signals to clock signal lines connected to odd-numbered groups of gate driving sub-circuits in the N groups of gate driving sub-circuits, not provide the clock signals to clock signal lines connected to even-numbered groups of gate driving sub-circuits in the N groups of gate driving sub-circuits or provide invalid clock signals to the clock signal lines connected to the even-numbered groups of gate driving sub-circuits; and upon providing the clock signals to the clock signal lines connected to the even-numbered groups of gate driving sub-circuits, not provide the clock signals to the clock signal lines connected to the odd-numbered groups of gate driving sub-circuits or provide the invalid clock signals to the clock signal lines connected to the odd-numbered groups of gate driving sub-circuits.

Figures 7A, 7B:
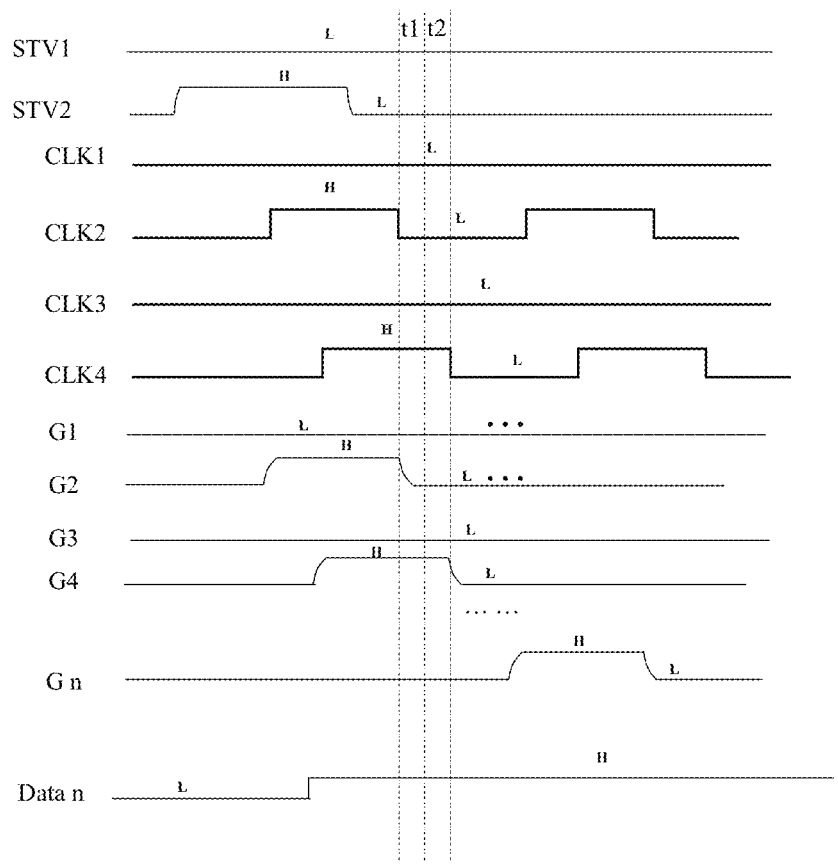
FIG. 7A is a schematic diagram of a timing sequence of corresponding to an x-th frame of display pattern provided by at least one embodiment of the present disclosure.
FIG. 7B is a schematic diagram of an x-th frame of display pattern provided by at least one embodiment of the present disclosure.
Figure 8A:
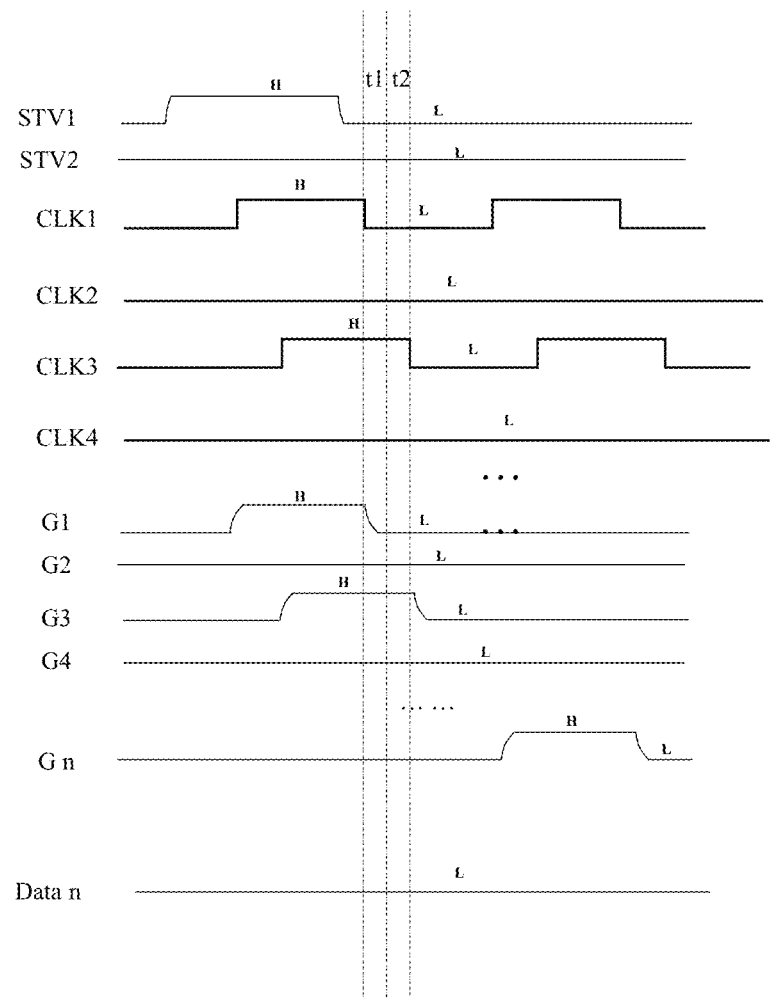
FIG. 8A is a schematic diagram of a timing sequence of corresponding to an (x+1)-th frame of display pattern provided by at least one embodiment of the present disclosure.
Figure 8B:
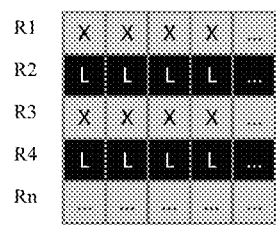
FIG. 8B is a schematic diagram of an (x+1)-th frame of display pattern provided by at least one embodiment of the present disclosure.

FIG. 7A is a schematic diagram of a timing sequence of corresponding to an x-th frame of display pattern provided by at least one embodiment of the present disclosure; FIG. 7B is a schematic diagram of an x-th frame of display pattern provided by at least one embodiment of the present disclosure; FIG. 8A is a schematic diagram of a timing sequence of corresponding to an (x+1)-th frame of display pattern provided by at least one embodiment of the present disclosure; FIG. 8B is a schematic diagram of an (x+1)-th frame of display pattern provided by at least one embodiment of the present disclosure. FIG. 7A and FIG. 8A are signal timing sequence diagrams corresponding to the gate driving circuit shown in FIG. 4; and for the signal timing sequences of the remaining gate driving circuits, reference may be made to the descriptions in FIG. 7A and FIG. 7B, which will not be repeated here.

For example, when the x-th frame (x is an integer greater than or equal to 1) is an odd-numbered frame, the (x+1)-th frame is an even-numbered frame; when the xth frame is an even-numbered frame, the (x+1)-th frame is an odd-numbered frame. The following description will be made by taking the xth frame as an odd-numbered frame and the (x+1)-th frame as an even-numbered frame as an example, which is not limited in the embodiment of the present disclosure.

For example, STV1 represents both the first trigger signal line and the first trigger signal; STV2 represents both the second trigger signal line and the second trigger signal; CLK1 represents both the first clock signal line and the first clock signal; CLK2 represents both the second clock signal line and the second clock signal; CLK3 represents both the third clock signal line and the third clock signal; CLK4 represents both the fourth clock signal line and the fourth clock signal; G1-Gn represent both the gate scanning signal lines connected to the shift registers of the plurality of stages arranged in sequence and the gate scanning signals; Datan represents the data signal; H represents a valid level; L represents an invalid level.

For example, as shown in FIG. 7A, upon the pixel array being driven to display the x-th frame of pattern, clock signals are provided to clock signal lines (eg, the first clock signal line CLK1 and the third clock signal line CLK3) connected to the odd-numbered groups (eg, the first group) of gate driving sub-circuits, so that the gate scanning signal lines G1 and G3 of odd-numbered rows in the plurality of gate scanning signal lines output gate scanning signals, for example, output the valid level H; the clock signals are not provided to clock signal lines (eg, the second clock signal line CLK2 and the fourth clock signal line CLK4) connected to the even-numbered groups (eg, the second group) of gate driving sub-circuits, or invalid clock signals (eg, a low-level L signal) are provided to clock signal lines connected to the even-numbered groups of gate driving sub-circuits, so that the gate scanning signal lines G2 and G4 of even-numbered rows in the plurality of gate scanning signal lines output invalid gate scanning signals (eg, output the invalid level L) or not output the gate scanning signals, so that the data transistors in the sub-pixels connected to the gate scanning signal lines G1 and G3 of odd-numbered rows are turned on in response to the valid level H of the gate scanning signal, so as to enable writing of the data signal Datan (eg, with a high level), resulting in the even-numbered rows of sub-pixels in the (x+1)-th frame of pattern being displayed as completely white.

For example, as shown in FIG. 8A, upon the pixel array being driven to display the (x+1)-th frame of pattern, clock signals are provided to clock signal lines (eg, the second clock signal line CLK2 and the fourth clock signal line CLK4) connected to the even-numbered groups (eg, the second group) of gate driving sub-circuits, so that the gate scanning signal lines G2 and G4 of even-numbered rows in the plurality of gate scanning signal lines output gate scanning signals, for example, output the valid level H; the clock signals are not provided to clock signal lines (eg, the first clock signal line CLK1 and the third clock signal line CLK3) connected to the odd-numbered groups (eg, the first group) of gate driving sub-circuits, or invalid clock signals are provided to clock signal lines connected to the odd-numbered groups of gate driving sub-circuits, so that the gate scanning signal lines G1 and G3 of odd-numbered rows in the plurality of gate scanning signal lines output invalid gate scanning signals or not output the gate scanning signals, for example, output the invalid level L, so that the data transistors in the sub-pixels connected to the gate scanning signal lines G2 and G4 of even-numbered rows are turned on in response to the valid level H of the gate scanning signal, so as to enable writing of the data signal Datan (eg, with a low level), resulting in the even-numbered rows of sub-pixels in the (x+1)-th frame of pattern being displayed as completely black.

For example, the invalid level is a signal that makes the transistor non-conductive, and the valid level is a signal that makes the transistor conductive.

For example, as shown in FIG. 7A, a time difference between clock signals (eg, the first clock signal CLK1 and the third clock signal CLK3) received by two adjacent clock signal lines connected to the odd-numbered groups of gate driving sub-circuits is 2 T (T=t1 or t2); for example, as shown in FIG. 8A, a time difference between clock signals (eg, the second clock signal CLK2 and the fourth clock signal CLK4) received by two adjacent clock signal lines connected to the even-numbered groups of gate driving sub-circuits is 2 T. For example, T is charging duration of one row of the sub-pixels.

For example, as shown in FIG. 4-FIG. 6B, the clock controller 300 is further connected to the N trigger signal lines and is further configured to: upon providing valid trigger signals to trigger signal lines (eg, the first trigger signal line STV1) connected to the odd-numbered groups of gate driving sub-circuits, provide invalid trigger signals or not provide the valid trigger signals to trigger signal lines (eg, the second trigger signal line STV2) connected to the even-numbered groups of gate driving sub-circuits; and upon providing the valid trigger signals to the trigger signal lines (eg, the second trigger signal line STV2) connected to the even-numbered groups of gate driving sub-circuits, provide the invalid trigger signals or not provide the valid trigger signals to the trigger signal lines (eg, the first trigger signal line STV1) connected to the odd-numbered groups of gate driving sub-circuits.

For example, as shown in FIG. 7A, upon the pixel array being driven to display an x-th frame of pattern, a valid trigger signal is provided to the first trigger signal line STV1, so that the first group of gate driving sub-circuits starts to output gate scanning signals by odd-numbered rows, an invalid trigger signal is provided or the valid trigger signal is not provided to the second trigger signal line STV2, so that the second group of gate driving sub-circuits does not work, that is, the gate scanning signal is not output.

For example, as shown in FIG. 8A, upon the pixel array being driven to display an (x+1)-th frame of pattern, a valid trigger signal is provided to the second trigger signal line STV2, so that the second group of gate driving sub-circuits starts to output gate scanning signals by even-numbered rows, an invalid trigger signal is provided or the valid trigger signal is not provided to the first trigger signal line STV1, so that the first group of gate driving sub-circuits does not work, that is, the gate scanning signal is not output.

For example, in some examples, the odd-numbered groups of gate driving sub-circuits (eg, the first group of gate driving sub-circuits in FIG. 3A or the first group of gate driving sub-circuits and the second group of gate driving sub-circuits in FIG. 3B) in the N-groups of gate driving sub-circuits are connected to odd-numbered rows of sub-pixels to provide the gate scanning signals, respectively; the even-numbered groups of gate driving sub-circuits (eg, the second group of gate driving sub-circuits in FIG. 3A or the second group of gate driving sub-circuits and the fourth group of gate driving sub-circuits in FIG. 3B) in the N-groups of gate driving sub-circuits are connected to even-numbered rows of sub-pixels, respectively.

For example, in some examples, the data driving circuit 30 is configured to: upon the pixel array being driven to display an x-th frame of pattern, provide a data signal with a first level to the plurality of data lines; and upon the pixel array being driven to display an (x+1)-th frame of pattern, provide a data signal with a second level to the plurality of data lines.

For example, as shown in FIG. 7A, upon the pixel array being driven to display the x-th frame of pattern, the data signal with the first level (eg, a high level) is provide to the plurality of data lines, so that, when the odd-numbered rows of sub-pixels are charged in response to the odd-numbered rows of gate driving signals (eg, G1, G3, etc.), the data signal with the first level is written, resulting in the odd-numbered rows of sub-pixels (eg, the first row of sub-pixels R1 and the third row of sub-pixels R3) being displayed all white, of which a specific display pattern is shown as in FIG. 7B.

For example, as shown in FIG. 8A, upon the pixel array being driven to display the (x+1)-th frame of pattern, the data signal with the second level (eg, a low level) is provide to the plurality of data lines, so that, when the even-numbered rows of sub-pixels are charged in response to the even-numbered rows of gate driving signals (eg, G2, G4, etc.), the data signal with the second level is written, resulting in the even-numbered rows of sub-pixels (eg, the second row of sub-pixels R2 and the fourth row of sub-pixels R4) being displayed all black, of which a specific display pattern is shown as in FIG. 8B.

It should be noted that, upon the pixel array being driven to display the x-th frame of pattern, the data signal with a second level (eg, a low level) may also be provided to the plurality of data lines, so that, when the odd-numbered rows of sub-pixels are charged in response to the odd-numbered rows of gate driving signals (eg, G1, G3, etc.), the data signal with the second level is written, resulting in the odd-numbered rows of sub-pixels (eg, the first row of sub-pixels R1 and the third row of sub-pixels R3) being displayed all black, of which a specific display pattern is shown as in FIG. 8B; upon the pixel array being driven to display the (x+1)-th frame of pattern, the data signal with the first level (eg, a high level) is provide to the plurality of data lines, so that, when the even-numbered rows of sub-pixels are charged in response to the even-numbered rows of gate driving signals (eg, G2, G4, etc.), the data signal with the first level is written, resulting in the even-numbered rows of sub-pixels (eg, the second row of sub-pixels R2 and the fourth row of sub-pixels R4) being displayed all white, of which a specific display pattern is shown as in FIG. 7B; the details may depend on the real-time situation, as long as the odd-numbered rows and even-numbered rows of two adjacent frames of display patterns are displayed as black and white display patterns, which is not limited in the embodiments of the present disclosure.

For example, based on the above-mentioned driving, it is possible to obtain the x-th frame of display pattern in which the odd-numbered rows of sub-pixels are displayed all white and the (x+1)-th frame of display pattern in which the even-numbered rows of sub-pixels are displayed all black; of course, it is also possible to obtain the x-th frame of display pattern in which the even-numbered rows of sub-pixels are displayed all white and the (x+1)-th frame of display pattern in which the odd-numbered rows of sub-pixels are displayed all black.

According to the visual stop effect of human eyes, based on the x-th frame of display pattern in which the odd-numbered rows of sub-pixels are displayed all white as shown in FIG. 7B and the (x+1)-th frame of display pattern in which the even-numbered rows of sub-pixels are displayed all black as shown in FIG. 8B, the human eyes may see the clear H-1 line pattern shown in FIG. 1C, making odd-numbered frames display odd-numbered rows in conjunction with data signals, and making even-numbered frames display even-numbered rows in conjunction with data signals, thereby realizing a clear display of the H-1 Line pattern without cross-row problems, meeting industry test standards of CM value, and improving performance of display products.

For example, in the embodiment of the present disclosure, when the odd/even rows of gate scanning signals are output, the level of the data signal Datan is matched to realize H-1 Line for the white/black pattern. For example, odd-numbered frame: the first trigger signal line STV1+odd-numbered rows of gate scanning signals output+the first level of the data signal Datan is given to the white pattern, so that the odd-numbered rows of sub-pixels are displayed white, and the even-numbered rows of sub-pixels are in the state of maintaining the previous data after the end of the frame; even-numbered frame: the second trigger signal line STV2+ even-numbered rows of gate scanning signals output+the second level of the data signal Datan is given to the black pattern, so that the even-numbered rows of sub-pixels are displayed black, and the odd-numbered rows of sub-pixels are in the state of maintaining the previous data after the end of the frame. After the data of the even-numbered and odd-numbered frames are combined, the sub-pixels may display a clear H-1 line pattern as shown in FIG. 1C.

Figure 9A:
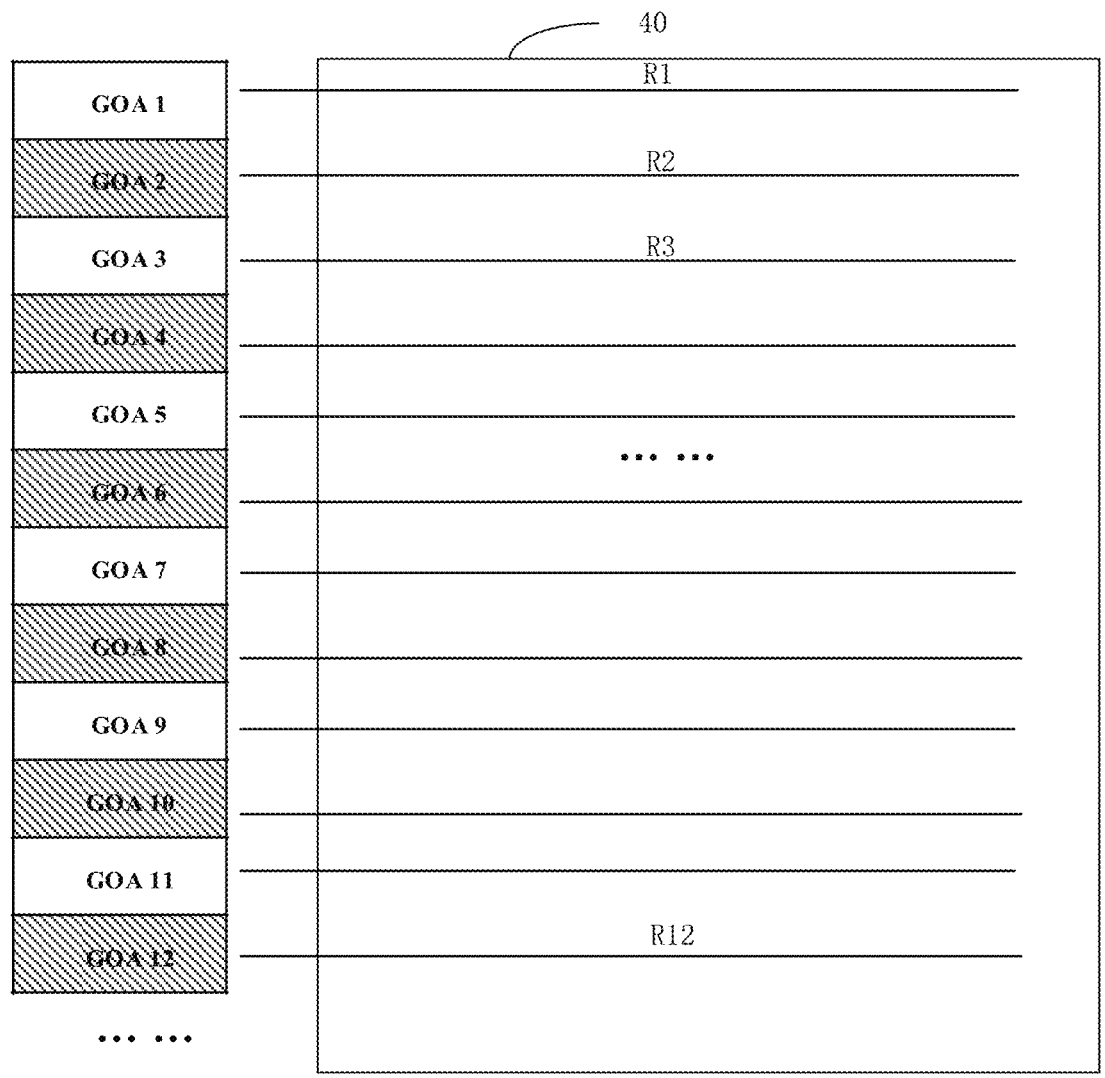
FIG. 9A is a schematic diagram of a position relationship of a gate driving circuit provided by at least one embodiment of the present disclosure.
Figure 9B:
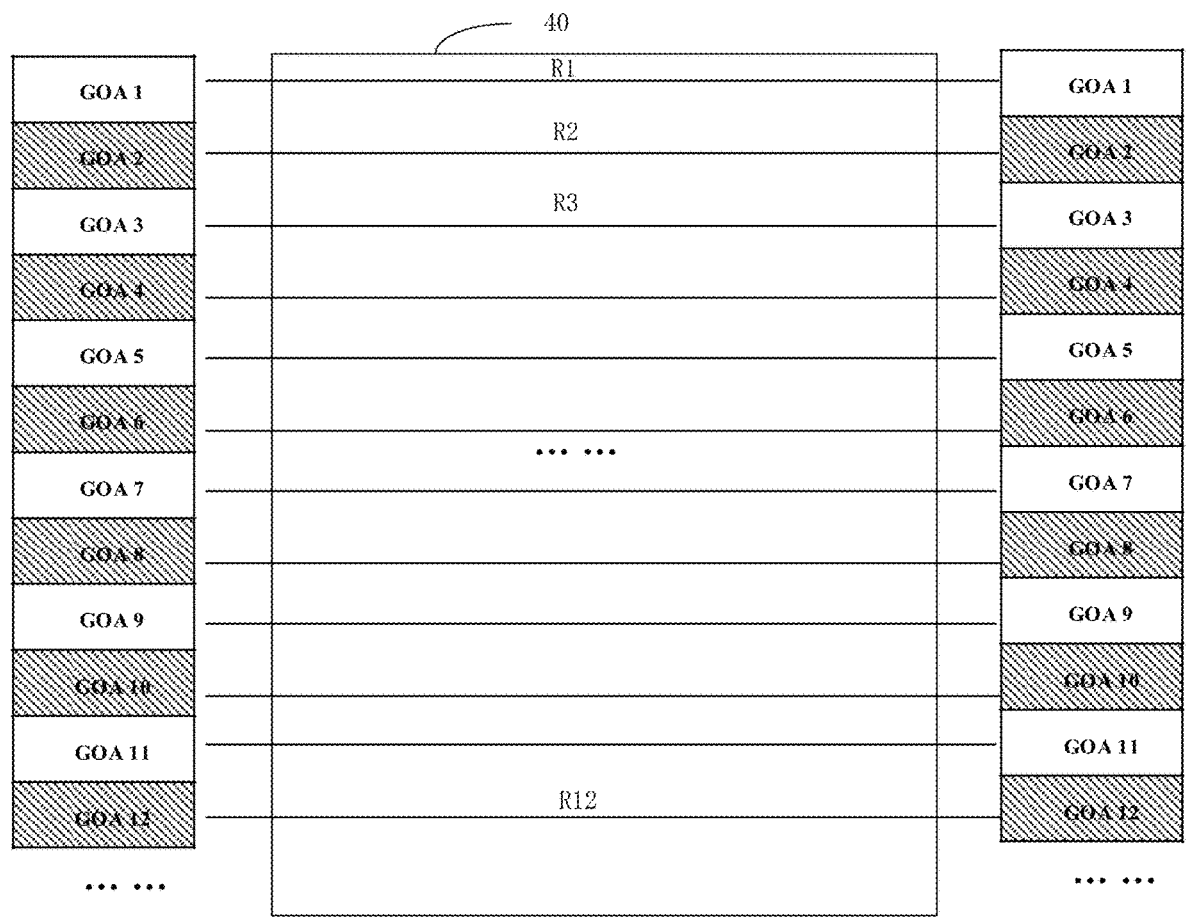
FIG. 9B is a schematic diagram of the position relationship of another gate driving circuit provided by at least one embodiment of the present disclosure.

FIG. 9A is a schematic diagram of a position relationship of a gate driving circuit provided by at least one embodiment of the present disclosure; FIG. 9B is a schematic diagram of the position relationship of another gate driving circuit provided by at least one embodiment of the present disclosure.

For example, in some examples, as shown in FIG. 9A, the gate driving circuit 10 is located on one side of the pixel array (eg, in the display region 40), and the shift register unit of all states are connected to one row of sub-pixels, respectively, so as to drive the row of sub-pixels to work (such as data signal writing).

For example, in some other examples, as shown in FIG. 9B, the gate driving circuit 10 is located on two sides of the pixel array to realize double-sided driving; the embodiments of the present disclosure do not limit the arrangement of the gate driving circuit 10. For example, shift registers located in a same stage of the gate driving circuits located on the two sides are used to drive a same row of sub-pixels. For example, as shown in FIG. 9B, the gate driving circuits located on two sides have the same structure and working principle, and the shift registers in the same stage are used to drive the same row of sub-pixels. For example, the shift register unit GOAL of the first stage on two sides are connected to the first row of sub-pixels of for driving the first row of sub-pixels, the shift register unit GOA2 of the second stage on two sides are connected to the second row of sub-pixels of for driving the second row of sub-pixels, and so on, so that the driving load of the gate scanning signal line is reduced and the driving capability of the gate driving circuit is improved.

For example, the structure and working principle of the shift registers and the sub-pixels may be designed in the art; for example, the sub-pixel includes a pixel driving circuit and a light-emitting element, the pixel driving circuit may be 4T1C, 4T2C, 7T1C, etc., and the light-emitting element may be an organic light-emitting diode or a quantum dot light-emitting diode, etc., which will not be repeated here. The embodiments of the present disclosure do not limit this.

In the embodiments of the present disclosure, the odd-numbered group of trigger signal lines (eg, the first trigger signal line STV1) works with the odd-numbered group of gate driving sub-circuits to connect the clock signal lines (eg, the first clock signal line CLK1 or the third clock signal line CLK3) to turn off the shift register of the even-numbered rows, and to match with the first level or the second level of the data signal Datan, so that the odd-numbered rows of the whole frame are displayed all black or all white; and the even-numbered group of trigger signal lines (eg, the second trigger signal line STV2) works with the even-numbered group of gate driving sub-circuits to connect the clock signal lines (eg, the second clock signal line CLK2 or the fourth clock signal line CLK4) to turn off the shift register of the odd-numbered rows, and to match with the second level or the first level of the data signal Datan, so that the even-numbered rows of the whole frame are displayed all white or all black; that is, the high and low levels of the data signal Datan corresponding to the odd-numbered frames and the even-numbered frames are opposite, and the CM value of the H-1 Line display pattern may be realized≈100%, which meets the industry test standard. That is, the data signal frame-by-frame display technology enables odd-numbered frames to display odd-numbered rows, and even-numbered frames to display even-numbered rows, thereby solving the cross-row problem of display patterns combined with light and dark lines.

Figure 9C:
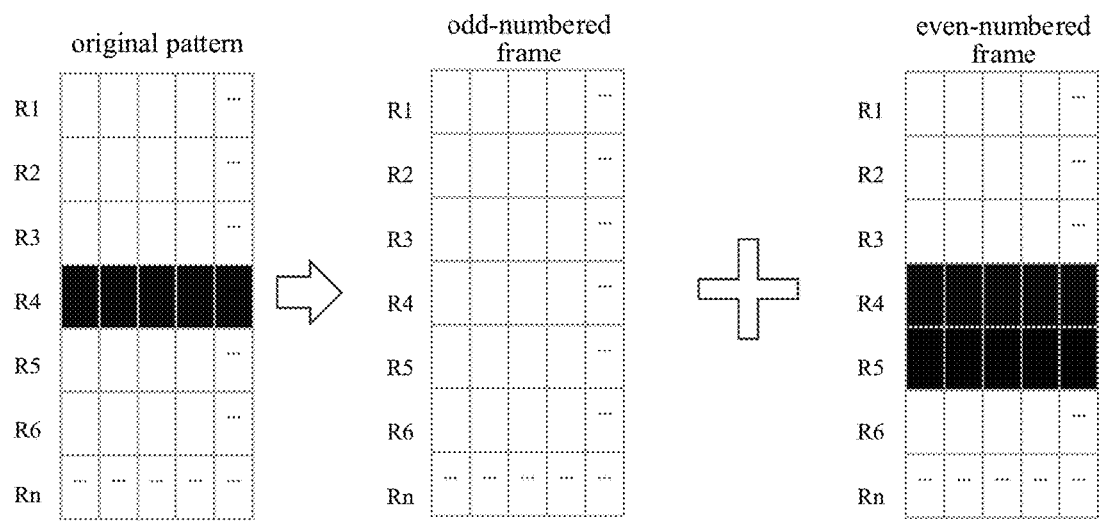
FIG. 9C is a schematic diagram of a display pattern combined with light and dark lines provided by at least one embodiment of the present disclosure.

It should be noted that the display panel provided by the embodiments of the present disclosure adopts the frame-by-frame driving technology (for example, the above-mentioned technology of odd-numbered frames displaying odd-numbered rows, and even-numbered frames displaying even-numbered rows), which is not limited to solving the problem of cross-row of display patterns of H-1 Line, which can also be used to solve the display problem of all combinations of light and dark lines (as shown in FIG. 9C); as long as a display pattern such as a line is detected, it is divided into frames by blanking (for example, blanking even-numbered rows in odd-numbered frames, and blanking odd-numbered rows in even-numbered frames), which doubles the pixel charging duration, thereby solving the cross-row problem; the resolution of the display panel may further be reduced and the refresh rate of the display panel may further be increased; for example, through the frame-by-frame display, when two groups of gate driving sub-circuits are included, in the driving process of each frame of the display pattern, in response to the trigger signals of the two trigger signal lines, there are two gate scanning signal lines simultaneously outputting gate scanning signals used for driving 2 rows of sub-pixels, so that the refresh rate of the display panel may be increased, and the resolution of the display panel may be reduced; for example, the resolution of the display panel is reduced from 8K to 4K, and the refresh rate is increased from 120 Hz to 240 Hz, so that, when the frame-by-frame technology is adopted, that is, the data signal Datan of odd-numbered rows (for example, the high level shown in FIG. 7A) is displayed as an odd-numbered frame, and the data signal Datan of the even-numbered rows (for example, the low level shown in FIG. 8A) is displayed as an even-numbered frame, the H-1 line cross-row problems of products with a resolution of 8K, a refresh rate of 120 Hz, a resolution of 4K or with a refresh rate of 240 Hz, and a short charging duration T of one row of sub-pixels may be solved, so as to improve the application scenarios of display panels.

FIG. 9C is a schematic diagram of a display pattern combined with light and dark lines provided by at least one embodiment of the present disclosure. For example, as shown in FIG. 9C, the original pattern can be obtained by combining the display patterns of odd-numbered frames and the display patterns of even-numbered frames, and the specific driving timing sequence is similar to the driving timing sequence provided by FIG. 7A and FIG. 8A, and details are not repeated here.

Figure 10:
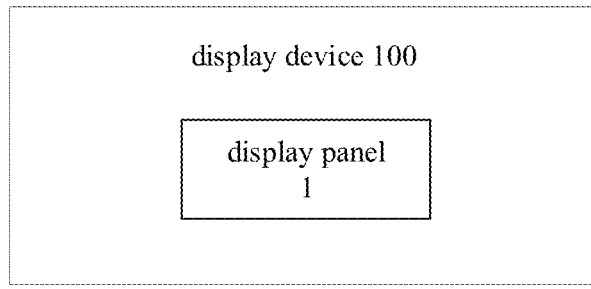
FIG. 10 is a schematic diagram of a display device provided by at least one embodiment of the present disclosure.

For example, at least one embodiment of the present disclosure further provides a display device. FIG. 10 is a schematic diagram of a display device provided by at least one embodiment of the present disclosure. For example, as shown in FIG. 10, the display device 100 includes the display panel 1 provided by any embodiment of the present disclosure.

It should be noted that the display device 100 in the embodiments may be any product or component with a display function, such as a liquid crystal panel, a liquid crystal TV, a display, an OLED panel, an OLED TV, an electronic paper display device, a mobile phone, a tablet computer, a notebook computer, a digital photo frame, a navigator, etc. The display device 100 may further include other conventional components such as a display panel, which is not limited in the embodiments of the present disclosure.

For the technical effects of the display device 100 provided by the embodiments of the present disclosure, reference may be made to the corresponding descriptions on the display panel in the above-mentioned embodiments, and details are not repeated here.

It should be noted that, for the sake of clarity and conciseness, the entire structure of the display device 100 is not given. In order to realize the necessary functions of the display device, those skilled in the art may set other structures not shown according to specific application scenarios, which are not limited in the embodiments of the present disclosure.

At least one embodiment of the present disclosure further provides a driving method for a display panel; for example, the display panel may be the display panel shown in FIG. 2 or may be other display panels in the art, which are not limited by the embodiments of the present disclosure.

The following takes the driving method of the display panel shown in FIG. 2 as an example for description, and the driving methods for display panel with other structures are similar to this, which will not be repeated here.

For example, as shown in FIG. 2, the display panel 1 includes a pixel array (eg, located in the display region 40) and a plurality of gate scanning signal lines GL; the pixel array includes a plurality of rows and a plurality of columns of sub-pixels 410, and the plurality of gate scanning signal lines GL are connected to the plurality of rows of sub-pixels 410.

Figure 11:
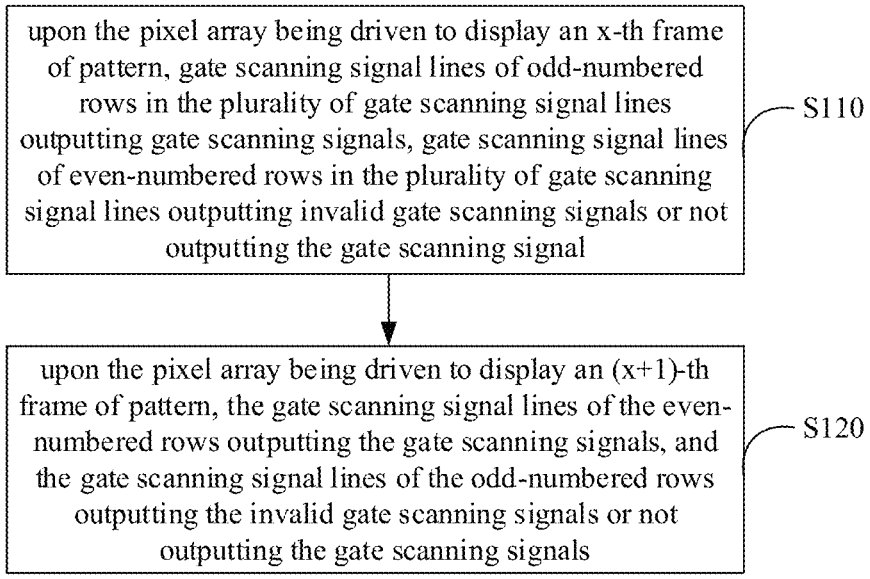
FIG. 11 is a flowchart of a driving method for a display panel provided by at least one embodiment of the present disclosure.

FIG. 11 is a flowchart of a driving method for a display panel provided by at least one embodiment of the present disclosure. For example, as shown in FIG. 11, the driving method includes step S110 and step S120.

Step S110: upon the pixel array being driven to display an x-th frame of pattern, gate scanning signal lines of odd-numbered rows in the plurality of gate scanning signal lines outputting gate scanning signals, gate scanning signal lines of even-numbered rows in the plurality of gate scanning signal lines outputting invalid gate scanning signals or not outputting the gate scanning signal.

For example, in some examples, for example, as shown in FIG. 4-FIG. 6B, gate scanning signal lines of odd-numbered rows (eg, gate scanning signal lines G1, G3, G5, etc.) are also connected to odd-numbered group of gate driving sub-circuits (eg, the first group of gate driving sub-circuits); gate scanning signal lines of even-numbered rows (eg, gate scanning signal lines G2, G4, G6, etc.) are also connected to even-numbered group of gate driving sub-circuits (eg, the second group of gate driving sub-circuits) is connected to the even-numbered row gate scanning signal lines (eg gate scanning signal lines G2, G4, G6, etc.).

For example, as shown in FIG. 7A, upon the pixel array being driven to display the x-th frame of pattern, clock signals are provided to clock signal lines (eg, the first clock signal line CLK1 and the third clock signal line CLK3) connected to the odd-numbered groups (eg, the first group) of gate driving sub-circuits, so that the gate scanning signal lines G1 and G3 of odd-numbered rows in the plurality of gate scanning signal lines output gate scanning signals, for example, output the valid level H; the clock signals are not provided to clock signal lines (eg, the second clock signal e CLK2 and the fourth clock signal line CLK4) connected to the even-numbered groups (eg, the second group) of gate driving sub-circuits, or invalid clock signals (eg, a low-level L signal) are provided to clock signal lines connected to the even-numbered groups of gate driving sub-circuits, so that the gate scanning signal lines G2 and G4 of even-numbered rows in the plurality of gate scanning signal lines output invalid gate scanning signals (eg, output the invalid level L) or not output the gate scanning signals, so that the data transistors in the sub-pixels connected to the gate scanning signal lines G1 and G3 of odd-numbered rows are turned on in response to the valid level H of the gate scanning signal, so as to enable writing of the data signal Datan (eg, with a high level), resulting in the even-numbered rows of sub-pixels in the (x+1)-th frame of pattern being displayed as completely white.

For example, as shown in FIG. 7A, upon the pixel array being driven to display the x-th frame of pattern, time difference between the clock signals (for example, the first clock signal CLK1 and the third clock signal CLK3) provided by two adjacent clock signal lines connected to the odd-numbered groups of gate driving sub-circuits is 2 T (T=t1 or t2), for example, T is the charging duration of 1 row of sub-pixels.

For example, as shown in FIG. 7A, the driving method for display further includes: upon the pixel array being driven to display the x-th frame of pattern, providing valid trigger signals to trigger signal lines (eg, the first trigger signal line STV1) connected to the odd-numbered groups of gate driving sub-circuits, providing invalid trigger signals or not providing the valid trigger signals to trigger signal lines (eg, the second trigger signal line STV2) connected to the even-numbered groups of gate driving sub-circuits For example, as shown in FIG. 7A, upon the pixel array being driven to display an x-th frame of pattern, a valid trigger signal is provided to the first trigger signal line STV1, so that the first group of gate driving sub-circuits starts to output gate scanning signals by odd-numbered rows (eg, the first row G1, the third row G3), an invalid trigger signal is provided or the valid trigger signal is not provided to the second trigger signal line STV2, so that the second group of gate driving sub-circuits does not work, that is, the gate scanning signal is not output.

For example, when the display panel 1 further includes a plurality of data lines that are electrically connected to the plurality of columns of sub-pixels, the driving method further includes: upon the pixel array being driven to display the x-th frame of pattern, providing a first level to the plurality of data lines. For example, as shown in FIG. 7A, upon the pixel array being driven to display the x-th frame of pattern, the data signal with the first level (eg, a high level) is provide to the plurality of data lines, so that, when the odd-numbered rows of sub-pixels are charged in response to the odd-numbered rows of gate driving signals (eg, G1, G3, etc.), the data signal with the first level is written, resulting in the odd-numbered rows of sub-pixels (eg, the first row of sub-pixels R1 and the third row of sub-pixels R3) being displayed all white, of which a specific display pattern is shown as in FIG. 7B.

Step S120: upon the pixel array being driven to display an (x+1)-th frame of pattern, the gate scanning signal lines of the even-numbered rows outputting the gate scanning signals, and the gate scanning signal lines of the odd-numbered rows outputting the invalid gate scanning signals or not outputting the gate scanning signals.

For example, as shown in FIG. 8A, upon the pixel array being driven to display the (x+1)-th frame of pattern, clock signals are provided to clock signal lines (eg, the second clock signal line CLK2 and the fourth clock signal line CLK4) connected to the even-numbered groups (eg, the second group) of gate driving sub-circuits, so that the gate scanning signal lines G2 and G4 of even-numbered rows in the plurality of gate scanning signal lines output gate scanning signals, for example, output the valid level H; the clock signals are not provided to clock signal lines (eg, the first clock signal line CLK1 and the third clock signal line CLK3) connected to the odd-numbered groups (eg, the first group) of gate driving sub-circuits, or invalid clock signals are provided to clock signal lines connected to the odd-numbered groups of gate driving sub-circuits, so that the gate scanning signal lines G1 and G3 of odd-numbered rows in the plurality of gate scanning signal lines output invalid gate scanning signals or not output the gate scanning signals, for example, output the invalid level L, so that the data transistors in the sub-pixels connected to the gate scanning signal lines G2 and G4 of even-numbered rows are turned on in response to the valid level H of the gate scanning signal, so as to enable writing of the data signal Datan (eg, with a low level), resulting in the even-numbered rows of sub-pixels in the (x+1)-th frame of pattern being displayed as completely black.

For example, as shown in FIG. 8A, upon the pixel array being driven to display the (x+1)-th frame of pattern, time difference between the clock signals (for example, the second clock signal CLK2 and the fourth clock signal CLK4) provided by two adjacent clock signal lines connected to the even-numbered groups of gate driving sub-circuits is 2 T.

For example, as shown in FIG. 8A, the driving method for display further includes: upon the pixel array being driven to display the (x+1)-th frame of pattern, providing the valid trigger signals to the trigger signal lines (eg, the second trigger signal line STV2) connected to the even-numbered groups of gate driving sub-circuits, providing the invalid trigger signals or not providing the valid trigger signals to the trigger signal lines (eg, the first trigger signal line STV1) connected to the odd-numbered groups of gate driving sub-circuits.

For example, as shown in FIG. 8A, upon the pixel array being driven to display an (x+1)-th frame of pattern, a valid trigger signal is provided to the second trigger signal line STV2, so that the second group of gate driving sub-circuits starts to output gate scanning signals by even-numbered rows, an invalid trigger signal is provided or the valid trigger signal is not provided to the first trigger signal line STV1, so that the first group of gate driving sub-circuits does not work, that is, the gate scanning signal is not output.

For example, when the display panel 1 further includes a plurality of data lines that are electrically connected to the plurality of columns of sub-pixels, the driving method further includes: upon the pixel array being driven to display the (x+1)-th frame of pattern, providing a second level to the plurality of data lines.

For example, as shown in FIG. 8A, upon the pixel array being driven to display the (x+1)-th frame of pattern, the data signal with the second level (eg, a low level) is provide to the plurality of data lines, so that, when the even-numbered rows of sub-pixels are charged in response to the even-numbered rows of gate driving signals (eg, G2, G4, etc.), the data signal with the second level is written, resulting in the even-numbered rows of sub-pixels (eg, the second row of sub-pixels R2 and the fourth row of sub-pixels R4) being displayed all black, of which a specific display pattern is shown as in FIG. 8B.

For example, based on the above-mentioned driving, it is possible to obtain the x-th frame of display pattern in which the odd-numbered rows of sub-pixels are displayed all white and the (x+1)-th frame of display pattern in which the even-numbered rows of sub-pixels are displayed all black; of course, it is also possible to obtain the x-th frame of display pattern in which the even-numbered rows of sub-pixels are displayed all white and the (x+1)-th frame of display pattern in which the odd-numbered rows of sub-pixels are displayed all black; the details may depend on the real-time situation, as long as the odd-numbered rows and even-numbered rows of two adjacent frames of display patterns are displayed as black and white display patterns, which is not limited in the embodiments of the present disclosure.

According to the visual stop effect of human eyes, based on the x-th frame of display pattern in which the odd-numbered rows of sub-pixels are displayed all white as shown in FIG. 7B and the (x+1)-th frame of display pattern in which the even-numbered rows of sub-pixels are displayed all black as shown in FIG. 8B, the human eyes may see the clear H-1 line pattern shown in FIG. 1C, making odd-numbered frames display odd-numbered rows in conjunction with data signals, and making even-numbered frames display even-numbered rows in conjunction with data signals, thereby realizing a clear display of the H-1 Line pattern without cross-row problems, meeting industry test standards of CM value, and improving performance of display products.

For the technical effect and working principle of the driving method for the display panel provided by the embodiments of the present disclosure, reference may be made to the corresponding description of the display panel in the above-mentioned embodiments, which will not be repeated here.

The following should be noted:

(1) The drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only exemplary implementations of the present disclosure, and are not intended to limit the protection scope of the present disclosure. The protection scope of the present disclosure is based on the protection scope of the claims.

What is claimed is:

1. A display panel, comprising a gate driving circuit and N trigger signal lines, wherein the gate driving circuit comprises shift registers of a plurality of stages arranged in sequence, the shift registers of the plurality of stages arranged in sequence are combined into N groups of gate driving sub-circuits, and shift registers in the N groups of gate driving sub-circuits are cascaded, respectively, wherein the N trigger signal lines are connected to N groups of gate driving sub-circuits, respectively;

an m-th group of gate driving sub-circuits in the N groups of gate driving sub-circuits comprises a shift register of an m-th stage and a shift register of an (m+L*N)-th stage that are cascaded, wherein m is an integer that is greater than or equal to 1 and less than or equal to N, L is an integer that is greater than or equal to 1, and N is an even number that is greater than or equal to 2;

wherein an m-th trigger signal line in the N trigger signal lines is connected to an input terminal of the shift register of the m-th stage; and wherein the shift registers of the plurality of stages arranged in sequence comprise a plurality of dummy shift registers, and input terminals of dummy shift registers of N stages in the plurality of dummy shift registers are respectively connected to the N trigger signal lines to receive trigger signals.

2. The display panel according to claim 1, further comprising 4K clock signal lines, wherein the 4K clock signal lines comprise a first clock signal line to a (4K)-th clock signal line, which are connected to clock signal terminals of the shift registers of the plurality of stages, respectively, to provide clock signals, wherein K is an integer that is greater than or equal to 1.

3. The display panel according to claim 2, wherein, in a case where K=1, the 4K clock signal lines comprise a first clock signal line, a second clock signal line, a third clock signal line and a fourth clock signal line, the first clock signal line is connected to a clock signal terminal of a shift register of a (4n−3)-th stage; the second clock signal line is connected to a clock signal terminal of a shift register of a (4n−2)-th stage; the third clock signal line is connected to a clock signal terminal of a shift register of a (4n−1)-th stage; and the fourth clock signal line is connected to a clock signal terminal of a shift register of a (4n)-th stage, wherein n is an integer that is greater than or equal to 1.

4. The display panel according to claim 2, wherein, in a case where K=3, the 4K clock signal lines comprise a first clock signal line, a second clock signal line, a third clock signal line, a fourth clock signal line, a fifth clock signal line, a sixth clock signal line, a seventh clock signal line, an eighth clock signal line, a ninth clock signal line, a tenth clock signal line, an eleventh clock signal line, and a twelfth clock signal line, the first clock signal line is connected to a clock signal terminal of a shift register of a (12n−11)-th stage; the second clock signal line is connected to a clock signal terminal of a shift register of a (12n−10)-th stage; the third clock signal line is connected to a clock signal terminal of a shift register of a (12n−9)-th stage; the fourth clock signal line is connected to a clock signal terminal of a shift register of a (12n−8)-th stage; the fifth clock signal line is connected to a clock signal terminal of a shift register of a (12n−7)-th stage; the sixth clock signal line is connected to a clock signal terminal of a shift register of a (12n−6)-th stage; the seventh clock signal line is connected to a clock signal terminal of a shift register of a (12n−5)-th stage; the eighth clock signal line is connected to a clock signal terminal of a shift register of a (12n−4)-th stage; the ninth clock signal line is connected to a clock signal terminal of a shift register of a (12n−3)-th stage; the tenth clock signal line is connected to a clock signal terminal of a shift register of a (12n−2)-th stage; the eleventh clock signal line is connected to a clock signal terminal of a shift register of a (12n−1)-th stage; and the twelfth clock signal line is connected to a clock signal terminal of a shift register of a (12n)-th stage, wherein n is an integer greater that is than or equal to 1.

5. The display panel according to claim 2, wherein, in a case where N=2, the N trigger signal lines comprise a first trigger signal line and a second trigger signal line, the first trigger signal line is connected to input terminals of shift registers of first K odd-numbered stages to provide a first trigger signal, and input terminals of shift registers of remaining odd-numbered stages are respectively connected to output terminals of shift registers of preceding stages that are respectively separated by K−1 odd-numbered stages;

the second trigger signal line is connected to input terminals of shift registers of first K even-numbered stages to provide a second trigger signal, and input terminals of shift registers of remaining even-numbered stages are respectively connected to output terminals of shift registers of preceding stages that are respectively separated by K−1 even-numbered stages.

6. The display panel according to claim 5, further comprising: a clock controller, which is connected to the 4K clock signal lines and is configured to:

upon providing clock signals to clock signal lines connected to odd-numbered groups of gate driving sub-circuits in the N groups of gate driving sub-circuits, not provide the clock signals to clock signal lines connected to even-numbered groups of gate driving sub-circuits in the N groups of gate driving sub-circuits or provide invalid clock signals to the clock signal lines connected to the even-numbered groups of gate driving sub-circuits; and upon providing the clock signals to the clock signal lines connected to the even-numbered groups of gate driving sub-circuits, not provide the clock signals to the clock signal lines connected to the odd-numbered groups of gate driving sub-circuits or provide the invalid clock signals to the clock signal lines connected to the odd-numbered groups of gate driving sub-circuits.

7. The display panel according to claim 6, wherein a time difference between clock signals received by two adjacent clock signal lines connected to the odd-numbered groups of gate driving sub-circuits is 2T, and a time difference between clock signals received by two adjacent clock signal lines connected to the even-numbered groups of gate driving sub-circuits is 2T, wherein T is a charging duration of one row of sub-pixels.

8. The display panel according to claim 6, wherein the clock controller is further connected to the N trigger signal lines, and is further configured to:

upon providing valid trigger signals to trigger signal lines connected to the odd-numbered groups of gate driving sub-circuits, provide invalid trigger signals or not provide the valid trigger signals to trigger signal lines connected to the even-numbered groups of gate driving sub-circuits; and upon providing the valid trigger signals to the trigger signal lines connected to the even-numbered groups of gate driving sub-circuits, provide the invalid trigger signals or not provide the valid trigger signals to the trigger signal lines connected to the odd-numbered groups of gate driving sub-circuits.

9. The display panel according to claim 1, further comprising: a pixel array which is connected to the gate driving circuit,
   wherein the pixel array comprises a plurality of rows of sub-pixels and a plurality of columns of sub-pixels;
   the odd-numbered groups of gate driving sub-circuits in the N groups of gate driving sub-circuits are connected to odd-numbered rows of sub-pixels, respectively,
   the even-numbered groups of gate driving sub-circuits in the N groups of gate driving sub-circuits are connected to even-numbered rows of sub-pixels, respectively.

10. The display panel according to claim 9, further comprising a data driving circuit and a plurality of data lines,
    wherein the plurality of data lines are electrically connected to the plurality of columns of sub-pixels, and are configured to transmit data signals provided by the data driving circuit to the plurality of columns of sub-pixels; and
    the data driving circuit is configured to:
       upon the pixel array being driven to display an x-th frame of pattern, provide a data signal with a first level to the plurality of data lines, and
       upon the pixel array being driven to display an (x+1)-th frame of pattern, provide a data signal with a second level to the plurality of data rows,
    wherein x is an integer greater than or equal to 1.

11. The display panel according to claim 9, wherein the gate driving circuit is on one side of the pixel array.

12. The display panel according to claim 9, wherein the gate driving circuits are on two sides of the pixel array, and shift registers in a same stage of the gate driving circuits located on the two sides are used to drive a same row of sub-pixels.

13. A display device, comprising the display panel according to claim 1.

14. A driving method for a display panel, wherein the display panel comprises a pixel array and a plurality of gate scanning signal lines, the pixel array comprises a plurality of rows of sub-pixels and a plurality of columns of sub-pixels, and the plurality of gate scanning signal lines are connected to the plurality of rows of sub-pixels, respectively,
    the method comprises:
       upon the pixel array being driven to display an x-th frame of pattern, gate scanning signal lines of odd-numbered rows in the plurality of gate scanning signal lines outputting gate scanning signals, gate scanning signal lines of even-numbered rows in the plurality of gate scanning signal lines outputting invalid gate scanning signals or not outputting the gate scanning signal; and
       upon the pixel array being driven to display an (x+1)-th frame of pattern, the gate scanning signal lines of the even-numbered rows outputting the gate scanning signals, and the gate scanning signal lines of the odd-numbered rows outputting the invalid gate scanning signals or not outputting the gate scanning signals,
    wherein x is an odd number greater than or equal to 1.

15. The driving method according to claim 14, wherein the gate scanning signal lines of the odd-numbered rows are further connected to odd-numbered groups of gate driving sub-circuits, and the gate scanning signal lines of the even-numbered rows are further connected to even-numbered groups of gate driving sub-circuits,
    upon the pixel array being driven to display the x-th frame of pattern, clock signals are provided to clock signal lines connected to the odd-numbered groups of gate driving sub-circuits, the clock signals are not provided to or invalid clock signals are provided to clock signal lines connected to the even-numbered groups of gate driving sub-circuits; and
    upon the pixel array being driven to display the (x+1)-th frame of pattern, the clock signals are provided to the clock signal lines connected to the even-numbered groups of gate driving sub-circuits, the clock signals are not provided to or the invalid clock signals are provided to clock signal lines connected to the odd-numbered groups of gate driving sub-circuits.

16. The driving method according to claim 15, wherein
    upon the pixel array being driven to display the x-th frame of pattern, a time difference between clock signals provided by two adjacent clock signal lines connected to the odd-numbered groups of gate driving sub-circuits is 2T, and
    upon the pixel array being driven to display the (x+1)-th frame of pattern, a time difference between clock signals provided by two adjacent clock signal lines connected to the even-numbered groups of gate driving sub-circuits is 2T,
    wherein T is a charging duration of one row of sub-pixels.

17. The driving method according to claim 15, further comprising:
    upon the pixel array being driven to display the x-th frame of pattern, providing valid trigger signals to trigger signal lines connected to the odd-numbered groups of gate driving sub-circuits, providing invalid trigger signals or not providing the valid trigger signals to trigger signal lines connected to the even-numbered groups of gate driving sub-circuits; and
    upon the pixel array being driven to display the (x+1)-th frame of pattern, providing the valid trigger signals to the trigger signal lines connected to the even-numbered groups of gate driving sub-circuits, providing the invalid trigger signals or not providing the valid trigger signals to the trigger signal lines connected to the odd-numbered groups of gate driving sub-circuits.

18. The driving method according to claim 14, wherein the display panel further comprises a plurality of data lines that are electrically connected to the plurality of columns of sub-pixels, respectively, the method further comprises:
    upon the pixel array being driven to display the x-th frame of pattern, providing a first level to the plurality of data lines; and
    upon the pixel array being driven to display the (x+1)-th frame of pattern, providing a second level to the plurality of data lines.

* * * * *